United States Patent
Yu et al.

(10) Patent No.: US 10,770,428 B2
(45) Date of Patent: Sep. 8, 2020

(54) SEMICONDUCTOR DEVICE AND METHOD

(71) Applicant: Taiwan Semiconductor Manufacturing Company, Ltd., Hsinchu (TW)

(72) Inventors: Chen-Hua Yu, Hsinchu (TW); Chun Hui Yu, Zhubei (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/458,646

(22) Filed: Jul. 1, 2019

(65) Prior Publication Data

US 2019/0393189 A1     Dec. 26, 2019

Related U.S. Application Data

(62) Division of application No. 16/017,299, filed on Jun. 25, 2018, now Pat. No. 10,340,249.

(51) Int. Cl.
*H01L 23/488*     (2006.01)
*H01L 23/00*     (2006.01)
(Continued)

(52) U.S. Cl.
CPC .......... *H01L 24/83* (2013.01); *H01L 21/486* (2013.01); *H01L 21/4857* (2013.01); *H01L 21/56* (2013.01); *H01L 21/561* (2013.01); *H01L 21/6835* (2013.01); *H01L 23/315* (2013.01); *H01L 23/3128* (2013.01);
(Continued)

(58) Field of Classification Search
CPC .. H01L 25/0657; H01L 21/2007; H01L 24/16
See application file for complete search history.

(56) References Cited

U.S. PATENT DOCUMENTS 7,208,839 B2 *  4/2007  Larson ................. H01L 21/563
                                                                    257/738
7,635,889 B2    12/2009  Isa et al.
(Continued)

FOREIGN PATENT DOCUMENTS

JP     2006295109 A     10/2006
JP        4454454 B2      4/2010
(Continued)

*Primary Examiner* — George R Fourson, III
(74) *Attorney, Agent, or Firm* — Slater Matsil, LLP

(57) ABSTRACT

In an embodiment, a device includes: a first device including: an integrated circuit device having a first connector; a first photosensitive adhesive layer on the integrated circuit device; and a first conductive layer on the first connector, the first photosensitive adhesive layer surrounding the first conductive layer; a second device including: an interposer having a second connector; a second photosensitive adhesive layer on the interposer, the second photosensitive adhesive layer physically connected to the first photosensitive adhesive layer; and a second conductive layer on the second connector, the second photosensitive adhesive layer surrounding the second conductive layer; and a conductive connector bonding the first and second conductive layers, the conductive connector surrounded by an air gap.

20 Claims, 71 Drawing Sheets

(51) Int. Cl.
*H01L 23/48* (2006.01)
*H01L 21/56* (2006.01)
*H01L 21/48* (2006.01)
*H01L 25/065* (2006.01)
*H01L 23/31* (2006.01)
*H01L 21/683* (2006.01)
*H01L 21/20* (2006.01)

(52) U.S. Cl.
CPC ........ *H01L 23/3135* (2013.01); *H01L 23/481* (2013.01); *H01L 24/33* (2013.01); *H01L 24/81* (2013.01); *H01L 25/0657* (2013.01); H01L 21/2007 (2013.01); H01L 21/568 (2013.01); H01L 24/16 (2013.01); H01L 2221/68345 (2013.01); H01L 2221/68359 (2013.01); H01L 2221/68372 (2013.01); H01L 2221/68381 (2013.01); H01L 2224/3303 (2013.01); H01L 2224/83201 (2013.01); H01L 2224/83815 (2013.01)

(56) References Cited

U.S. PATENT DOCUMENTS

| | | | |
|---|---|---|---|
| 7,923,295 B2 | 4/2011 | Shim et al. | |
| 8,343,810 B2 | 1/2013 | Oh et al. | |
| 8,361,842 B2 | 1/2013 | Yu et al. | |
| 8,664,036 B2 | 3/2014 | Yamazaki et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,245,770 B2 | 1/2016 | Kim et al. | |
| 9,257,560 B2 | 2/2016 | Adachi et al. | |
| 10,290,611 B2 * | 5/2019 | Yu | ..................... H01L 23/49827 |
| 2006/0121690 A1 | 6/2006 | Pogge et al. | |
| 2006/0276096 A1 | 12/2006 | Wang et al. | |
| 2009/0218702 A1 | 9/2009 | Beyne et al. | |
| 2011/0291288 A1 | 12/2011 | Wu et al. | |
| 2012/0153506 A1 * | 6/2012 | Machida | ................ H01L 21/563 257/778 |
| 2012/0292746 A1 * | 11/2012 | Lee | ................... H01L 21/76898 257/621 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0105984 A1 | 5/2013 | Rathburn | |
| 2013/0168848 A1 | 7/2013 | Lin et al. | |
| 2013/0220688 A1 | 8/2013 | Kubo | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0069604 A1 | 3/2015 | Hwang et al. | |
| 2015/0155255 A1 | 6/2015 | Aoki et al. | |
| 2015/0179615 A1 * | 6/2015 | Watanabe | ............... H01L 24/16 257/737 |
| 2016/0197055 A1 | 7/2016 | Yu et al. | |
| 2018/0082982 A1 | 3/2018 | Dang et al. | |
| 2018/0261544 A1 * | 9/2018 | Kim | ................... H01L 21/7682 |
| 2018/0315733 A1 | 11/2018 | Lin et al. | |
| 2019/0027446 A1 | 1/2019 | Cheng et al. | |

FOREIGN PATENT DOCUMENTS

| | | |
|---|---|---|
| KR | 101168511 B1 | 7/2012 |
| TW | I463573 B | 12/2014 |
| TW | I472037 B | 2/2015 |
| TW | I509703 B | 11/2015 |
| TW | I538070 B | 6/2016 |
| TW | I611582 B | 1/2018 |

* cited by examiner

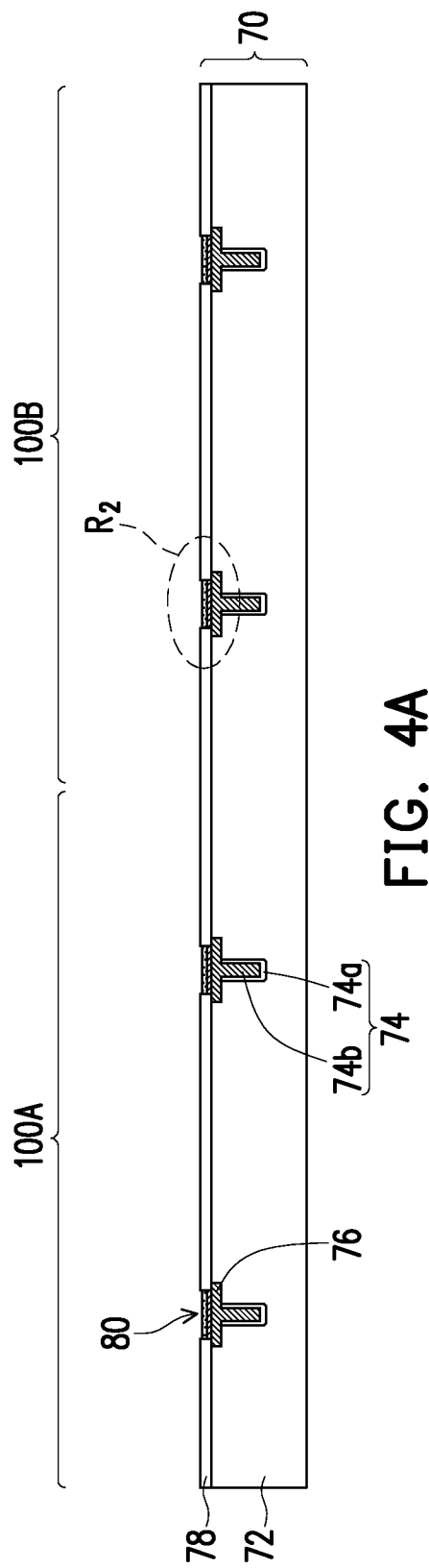
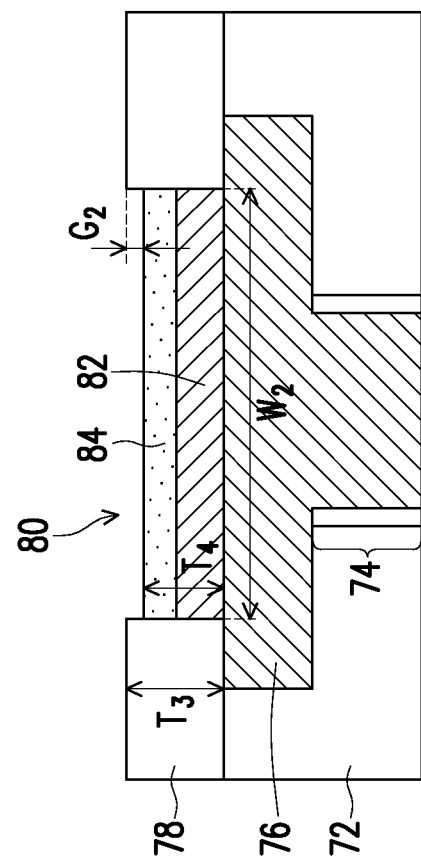
FIG. 4A
FIG. 4B

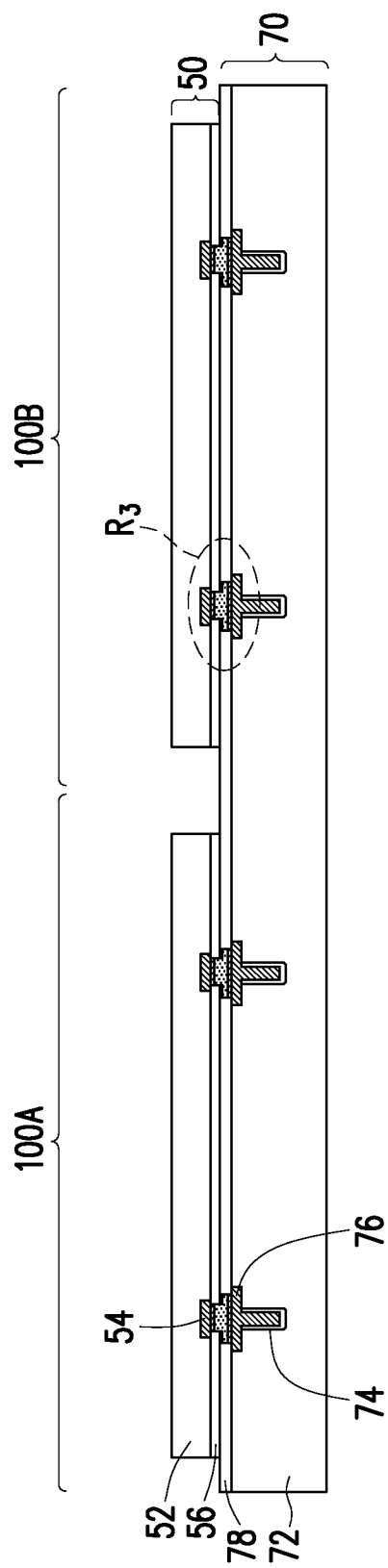
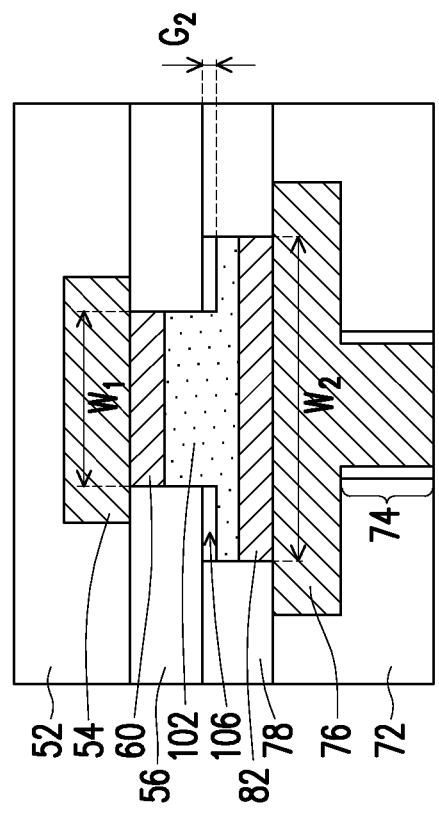
FIG. 6A
FIG. 6B

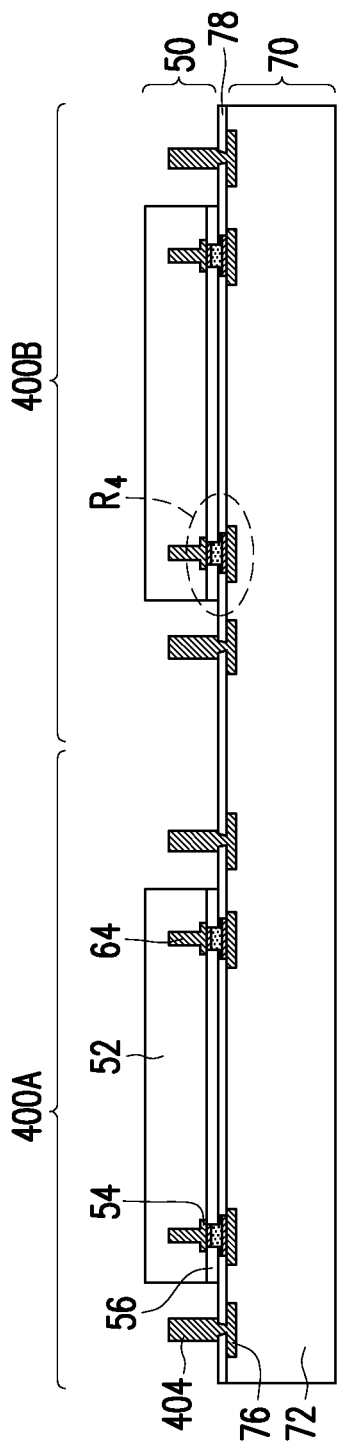
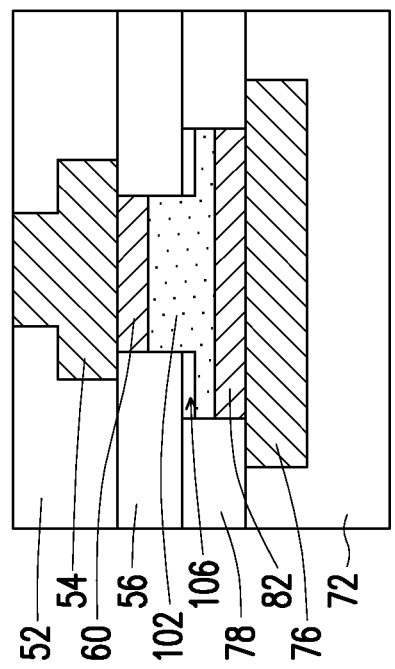
FIG. 25A
FIG. 25B

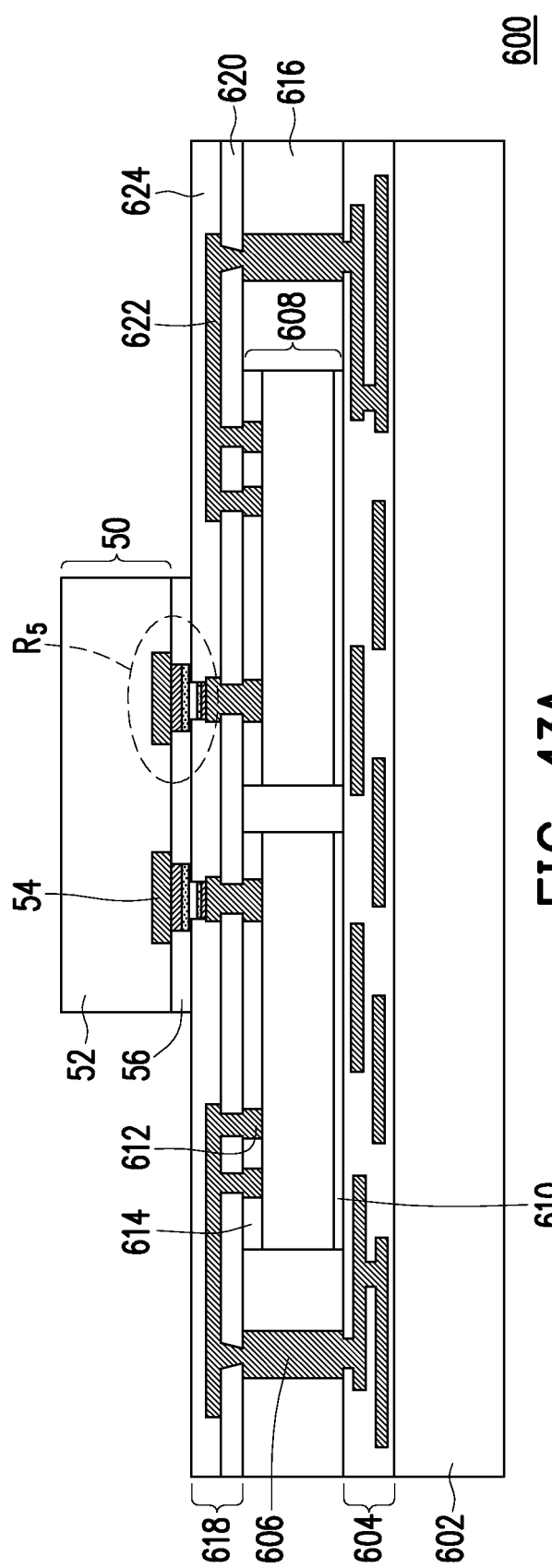
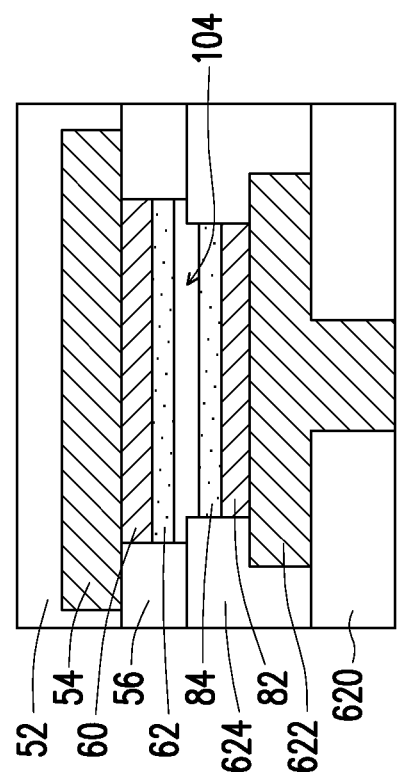
FIG. 43A
FIG. 43B

SEMICONDUCTOR DEVICE AND METHOD

PRIORITY CLAIM AND CROSS-REFERENCE

This application is a division of U.S. application Ser. No. 16/017,299, filed on Jun. 25, 2018, entitled "Semiconductor Device and Method," which application is hereby incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A through 4B are various views of intermediate steps during processing of a wafer, in accordance with some embodiments.

FIGS. 5A through 18 are various views of intermediate steps during a process for forming device packages, in accordance with some embodiments.

FIGS. 22 through 33 are various views of intermediate steps during a process for forming device packages, in accordance with some embodiments.

FIGS. 37 through 46 are various views of intermediate steps during a process for forming a device package, in accordance with some embodiments.

DETAILED DESCRIPTION

Figure 1A:
FIGS. 1A through 2B are various views of intermediate steps during processing of an integrated circuit device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a conductive connector is formed. Photosensitive adhesive films are formed on a die and a wafer. Openings are formed in the photosensitive adhesive films, exposing connectors of the die and wafer. Conductive layers and reflowable layers are plated in the openings. Notably, the combined thickness of the conductive and reflowable layers in each opening are less than the thickness of the photosensitive adhesive films. The die and wafer are physically connected to one another by the photosensitive adhesive films, and the die and wafer are then electrically connected to one another by reflowing the reflowable layers to form conductive connectors. Because the openings are under-filled with reflowable material, air gaps are formed around the resulting conductive connectors. Formation of the air gaps may provide a buffer around the conductive connectors, avoiding the risk of forming short circuits at decreased pitches between adjacent conductive connectors.

FIGS. 1A through 2B are various views of intermediate steps during processing of an integrated circuit device 50, in accordance with some embodiments. FIGS. 1A through 2B are cross-sectional views, where figures ending with an "A" designation show an overall view and figures ending with a "B" designation show a detailed view of a region $R_1$ from the corresponding "A" figure.

The integrated circuit device 50 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or a combination thereof. The integrated circuit device 50 may be formed in a wafer, which may include different device regions that are singulated in subsequent steps to form a plurality of integrated circuit devices 50. The integrated circuit device 50 includes a substrate 52 and connectors 54.

The substrate 52 may include a bulk semiconductor substrate, semiconductor-on-insulator (SOI) substrate, multi-layered semiconductor substrate, or the like. The semiconductor material of the substrate 52 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 52 may be doped or undoped. Devices, such as transistors, capacitors, resistors, diodes, and the like, may be formed in and/or on an active surface (e.g., the surface facing upward) of the substrate 52.

An interconnect structure having one or more dielectric layer(s) and respective metallization pattern(s) is formed on the active surface of the substrate 52. The dielectric layer(s) may be inter-metallization dielectric (IMD) layers. The IMD layers may be formed, for example, of a low-K dielectric material, such as undoped silicate glass (USG), phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, the connectors 54, such as conductive pillars or contact pads, are formed in and/or on the interconnect structure to provide an external electrical connection to the circuitry and devices. One of ordinary skill in the art will appreciate that the above examples are provided for illustrative purposes. Other circuitry may be used as appropriate for a given application.

Figure 1B:
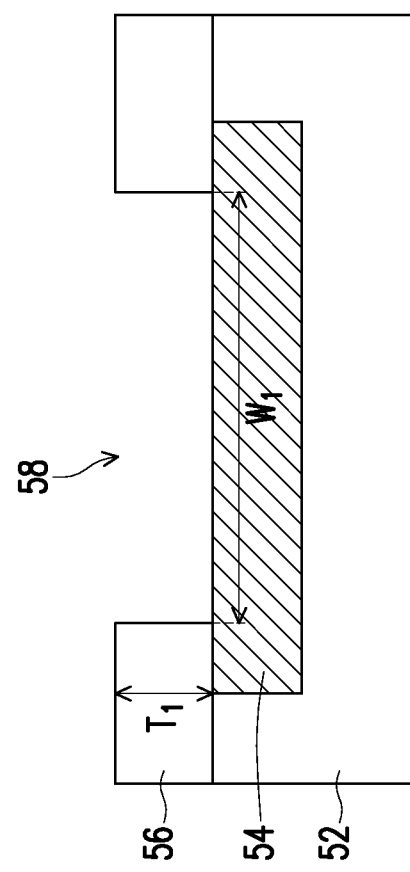

In FIGS. 1A and 1B, a photosensitive adhesive film 56 is formed on the active surface of the substrate 52. The photosensitive adhesive film 56 may be formed from an organic photosensitive polymer layer (PSPL) such as benzocyclobutene (BCB), epoxy resin film (SU-8), ShinEtsu SINR™, polyimide, or the like, and may be formed by spin coating or the like. The photosensitive adhesive film 56 may also be referred to as an adhesive layer. After formation, the photosensitive adhesive film 56 may be exposed to light for patterning. The pattern of the photosensitive adhesive film 56 corresponds to the connectors 54. The patterning forms a pattern of openings 58 through the photosensitive adhesive film 56, exposing portions of the connectors 54. Each of the openings 58 has a width $W_1$ that may be less than the width of the connectors 54, such as a width $W_1$ of from about 1 μm to about 40 μm. The width $W_1$ may also be greater than or equal to the width of the connectors 54. After the photosensitive adhesive film 56 is formed and patterned, it is cured by, e.g., an annealing process, which may be performed in an oven at a temperature of less than about 200° C. The formed photosensitive adhesive film 56 has a thickness $T_1$ of from about 1 μm to about 10 μm. The openings 58 have a depth equal to the thickness $T_1$.

Figure 2A:
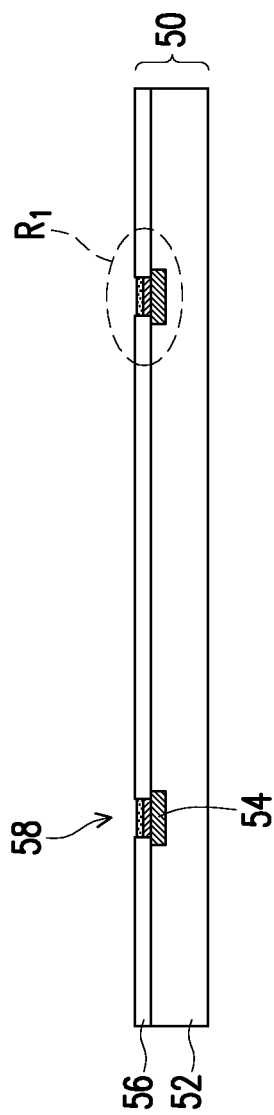
Figure 2B:
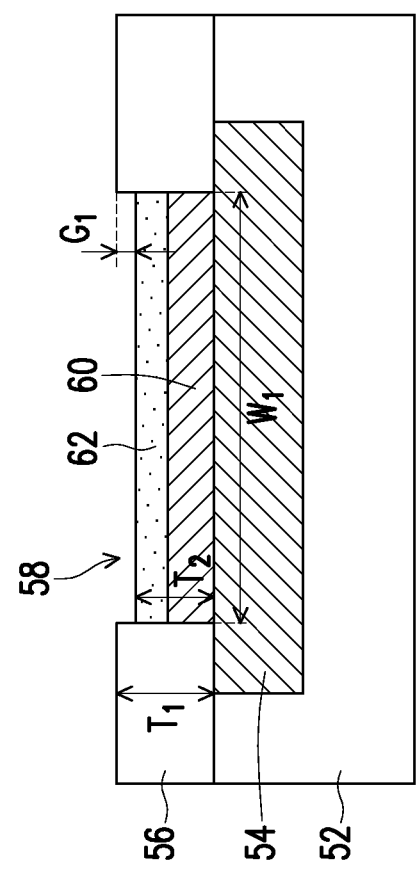

In FIGS. 2A and 2B, conductive layers 60 are formed in the openings 58 on the connectors 54. The conductive layers 60 are formed from a conductive material such as nickel, copper, gold, the like, or a combination thereof, and are formed by a plating process such as electroless plating using the connectors 54 in place of a seed layer. Reflowable layers 62 are then formed on the conductive layers 60 in the openings 58. The reflowable layers 62 are formed from a reflowable material such as solder, tin, the like, or a combination thereof, and are formed by a plating process using the conductive layers 60 in place of a seed layer.

The conductive layers 60 and reflowable layers 62 have a combined thickness $T_2$ of from about 1 μm to about 10 μm. The thickness $T_2$ is less than the thickness $T_1$. The thickness of the reflowable layers 62 is calculated according to the width $W_1$ such that sufficient reflowable material for subsequently formed conductive connectors is formed. As such, the top surface of the photosensitive adhesive film 56 extends above top surfaces of the reflowable layers 62. Gaps $G_1$ are formed, where the gaps $G_1$ have a depth equal to the difference between the thicknesses $T_1$ and $T_2$.

FIGS. 3A through 4B are various views of intermediate steps during processing of a wafer 70, in accordance with some embodiments. FIGS. 3A through 4B are cross-sectional views, where figures ending with an "A" designation show an overall view and figures ending with a "B" designation show a detailed view of a region $R_2$ from the corresponding "A" figure.

The wafer 70 includes multiple device regions 100A and 100B, in which integrated circuit devices 50 will be attached to form a plurality of devices. The devices formed in the wafer 70 may be interposers, integrated circuits dies, or the like. The wafer 70 includes a substrate 72, through vias 74, and connectors 76.

The substrate 72 may be a bulk semiconductor substrate, SOI substrate, multi-layered semiconductor substrate, or the like. The semiconductor material of the substrate 72 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 72 may be doped or undoped. In embodiments where interposers are formed in the wafer 70, the substrate 72 generally does not include active devices therein, although the interposers may include passive devices formed in and/or on a front surface (e.g., the surface facing upward) of the substrate 72. In embodiments where integrated circuits dies are formed in the wafer 70, devices such as transistors, capacitors, resistors, diodes, and the like, may be formed in and/or on the front surface of the substrate 72.

The through vias 74 are formed to extend from the front surface of the substrate 72 into substrate 72. The through vias 74 are also sometimes referred to as through-substrate vias or through-silicon vias (TSVs) when the substrate 72 is a silicon substrate. The through vias 74 may be formed by forming recesses in the substrate 72 by, for example, etching, milling, laser techniques, a combination thereof, and/or the like. A thin dielectric material may be formed in the recesses, such as by using an oxidation technique. A thin barrier layer 74a may be conformally deposited over the front side of the substrate 72 and in the openings, such as by CVD, ALD, PVD, thermal oxidation, a combination thereof, and/or the like. The barrier layer 74a may be formed from an oxide, a nitride, or an oxynitride, such as titanium nitride, titanium oxynitride, tantalum nitride, tantalum oxynitride, tungsten nitride, a combination thereof, and/or the like. A conductive material 74b may be deposited over the barrier layer 74a and in the openings. The conductive material 74b may be formed by an electro-chemical plating process, CVD, ALD, PVD, a combination thereof, and/or the like. Examples of conductive materials 74b are copper, tungsten, aluminum, silver, gold, a combination thereof, and/or the like. Excess conductive material 74b and barrier layer 74a is removed from the front side of the substrate 72 by, for example, CMP. The through vias 74 collectively include the barrier layer 74a and conductive material 74b, with the barrier layer 74a between the conductive material 74b and the substrate 72.

An interconnect structure is formed over the front surface of the substrate 72, and is used to electrically connect the integrated circuit devices (if any) and/or through vias 74 together and/or to external devices. The interconnect structure may include one or more dielectric layer(s) and respective metallization pattern(s) in the dielectric layer(s). The metallization patterns may include vias and/or traces to interconnect any devices and/or through vias 74 together and/or to an external device. The dielectric layers may be formed from silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the each of dielectric layers, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may be formed from one or more layers of TaN, Ta, TiN, Ti, CoW, or the like, deposited by ALD or the like, and the conductive material may be formed from copper, aluminum, tungsten, silver, combinations thereof, or the like, and may be deposited by CVD, PVD, or the like. Any excessive diffusion barrier layer and/or conductive material on the dielectric layer may be removed, such as by using a CMP. Additionally, the connectors 76, such as conductive pillars or contact pads, are formed in and/or on the interconnect structure to provide an external electrical connection to the through vias 74 and the metallization pattern(s) of the interconnect structure.

Figure 3A:
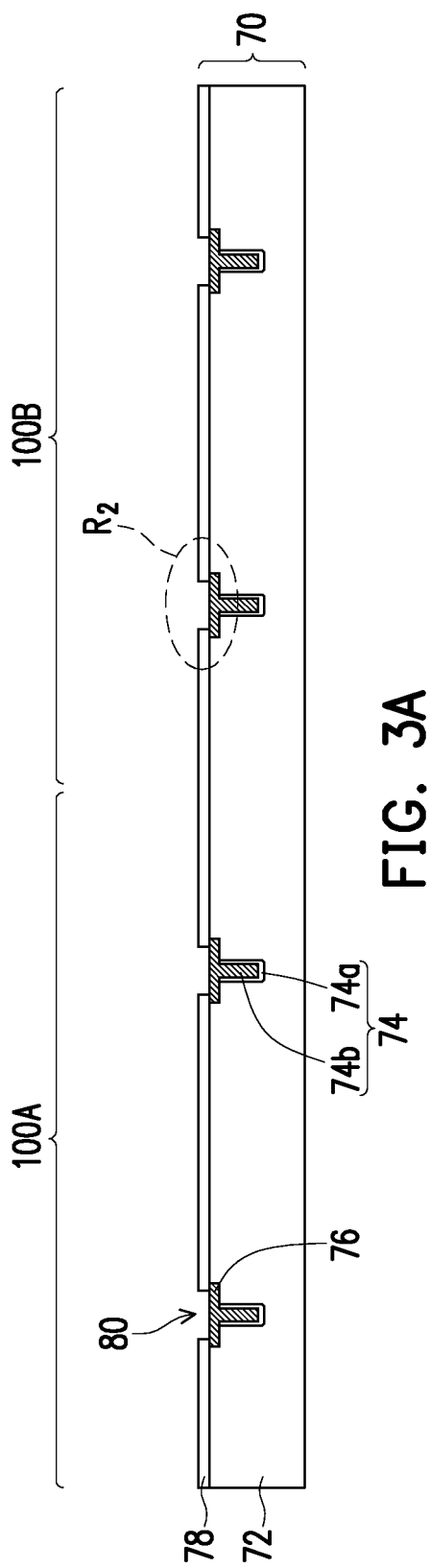
Figure 3B:
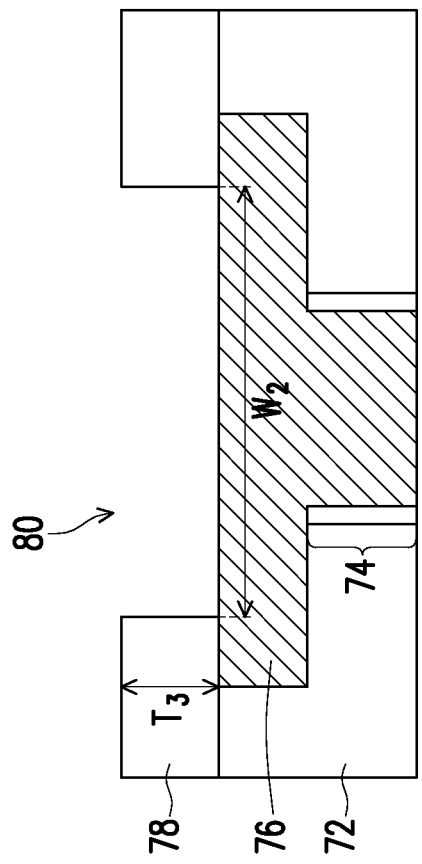

In FIGS. 3A and 3B, a photosensitive adhesive film 78 is formed on the front surface of the substrate 72. The photosensitive adhesive film 78 may be formed from a material similar to that of the photosensitive adhesive film 56, and may be formed by a method similar to that used to form the photosensitive adhesive film 56. After formation, the photosensitive adhesive film 78 may be exposed to light for patterning. The pattern of the photosensitive adhesive film 78 corresponds to the connectors 76. The patterning forms a pattern of openings 80 through the photosensitive adhesive film 78, exposing portions of the connectors 76. Each of the openings 80 has a width $W_2$ that may be less than the width of the connectors 76, such as a width $W_2$ of from about 1 μm to about 40 μm. The width $W_2$ may also be greater than or equal to the width of the connectors 76. The formed photosensitive adhesive film 78 has a thickness $T_3$ of from about 1 μm to about 5 μm. The openings 80 have a depth equal to the thickness $T_3$. In some embodiments, the photosensitive adhesive film 78 is not immediately cured after formation, but rather is cured after performing subsequent processing steps (see, e.g., FIGS. 6A and 6B).

In FIGS. 4A and 4B, conductive layers 82 are formed in the openings 80 on the connectors 76. The conductive layers 82 may be formed from a material similar to that of the conductive layers 60, and may be formed by a method similar to that used to form the conductive layers 60. Reflowable layers 84 are then formed on the conductive layers 82 in the openings 80. The reflowable layers 84 may be formed from a material similar to that of the reflowable layers 62, and may be formed by a method similar to that used to form the reflowable layers 62.

The conductive layers 82 and reflowable layers 84 have a combined thickness $T_4$ of from about 1 μm to about 5 μm. The thickness $T_4$ is less than the thickness $T_3$. As such, the top surface of the photosensitive adhesive film 78 extends above top surfaces of the reflowable layers 84. Gaps $G_2$ are formed, where the gaps $G_2$ have a depth equal to the difference between the thicknesses $T_3$ and $T_4$.

In accordance with some embodiments, integrated circuit device packages are formed by bonding the integrated circuit devices 50 to the front side of the wafer 70. Before the bonding, the integrated circuit devices 50 and wafer 70 may be processed according to processes illustrated above. A variety of integrated circuit device packages may be formed using such devices.

Figure 18:
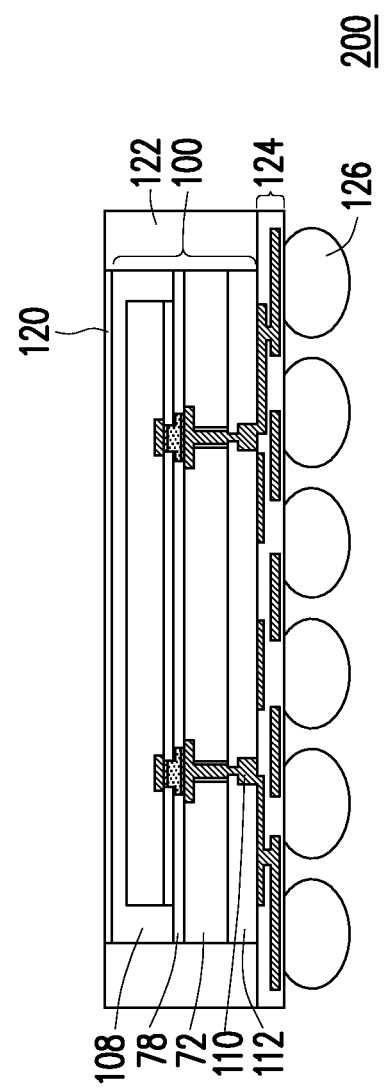
Figure 19:
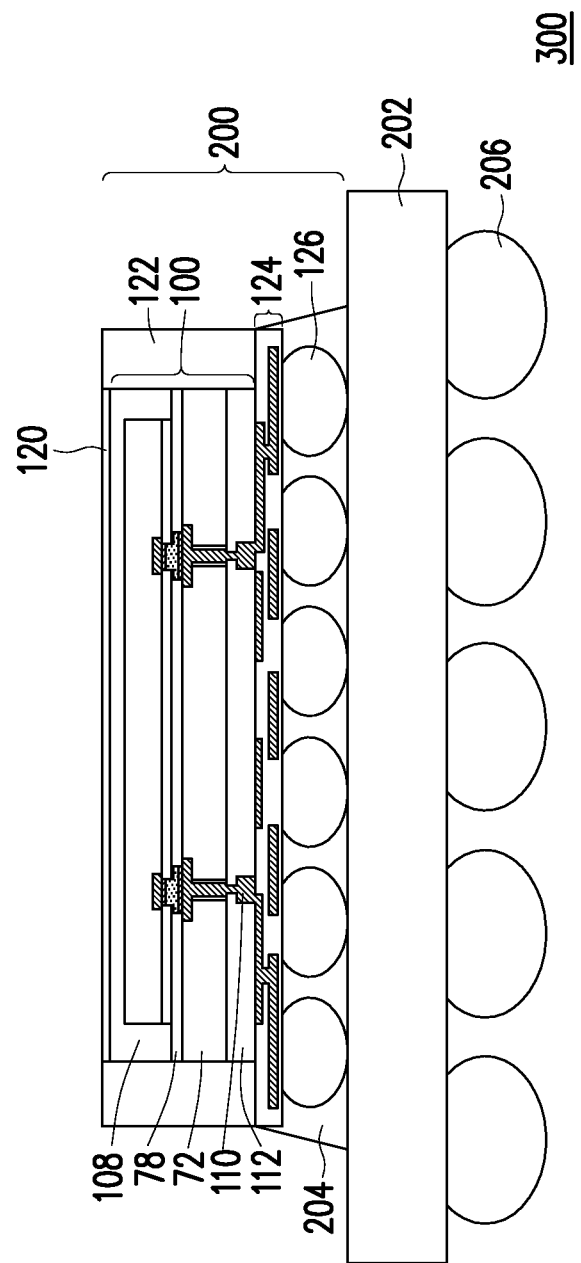
FIG. 19 is a view of a device package, in accordance with some embodiments.

FIGS. 5A through 18 are various views of intermediate steps during a process for forming device packages 200, in accordance with some embodiments. In FIGS. 5A through 11, intermediate packages 100 are formed by bonding the integrated circuit devices 50 to the front side of the wafer 70. The intermediate packages 100 are singulated. In FIGS. 12 through 18, further processing is performed to form the device packages 200. In an embodiment, the device packages 200 are chip-on-wafer (CoW) packages, although it should be appreciated that embodiments may be applied to other 3DIC packages. FIG. 19 is a view of a device package 300, in accordance with some embodiments. FIGS. 5A through 19 are cross-sectional views, where figures ending with an "A" designation show an overall view and figures ending with a "B" designation show a detailed view of a region R₃ from the corresponding "A" figure. In particular, the region R₃ shows formation of a conductive connector 102 (shown in FIG. 6B) coupling the connectors 54 of the integrated circuit devices 50 to the connectors 76 of the wafer 70.

Figure 5A:
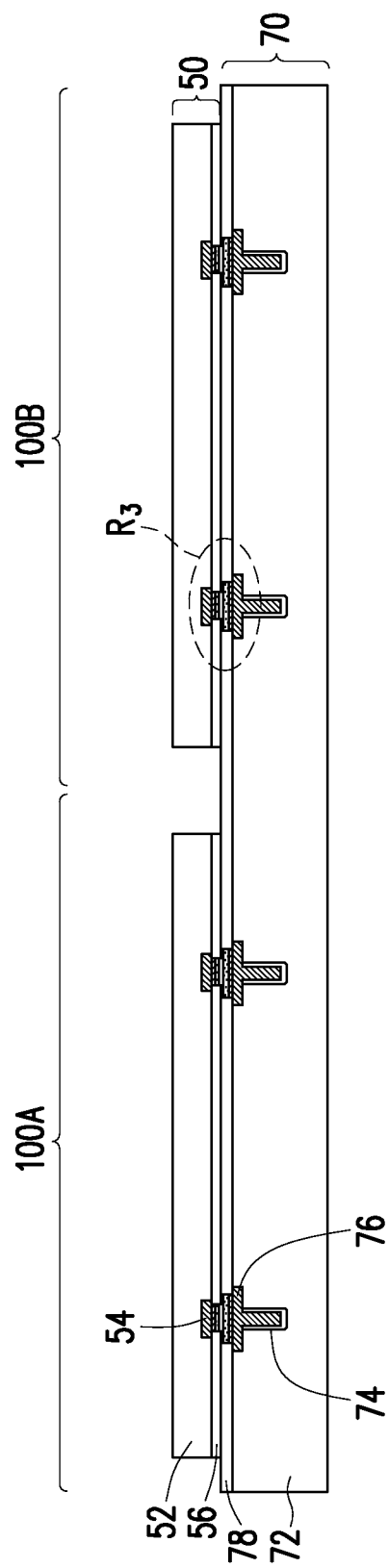
Figure 5B:
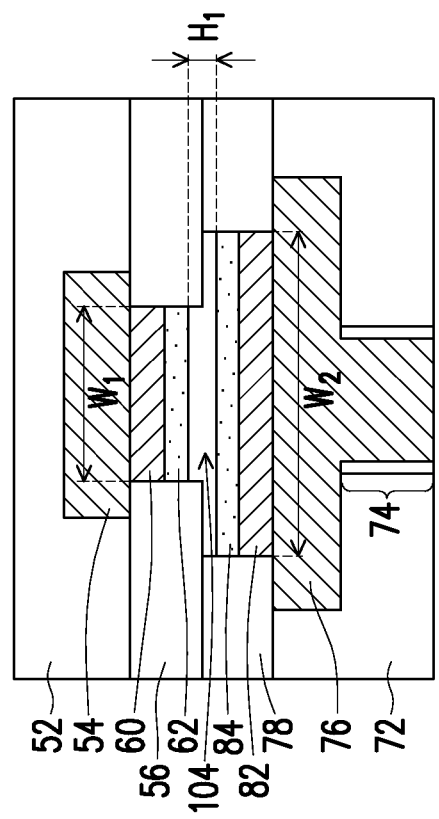

In FIGS. 5A and 5B, a plurality of the integrated circuit devices 50 are attached to the wafer 70. The integrated circuit devices 50 are located in the device regions 100A and 100B, which will be singulated in subsequent steps to form the intermediate packages 100. The integrated circuit devices 50 may be attached to the wafer 70 using, for example, a pick-and-place tool.

The integrated circuit devices 50 are attached to the wafer 70 by face-to-face bonds. The integrated circuit devices 50 are pressed against the wafer 70 such that the photosensitive adhesive films 56 and 78 adhere to one another. In embodiments where the photosensitive adhesive film 78 is not immediately cured after formation, the photosensitive adhesive films 56 and 78 share a cured-uncured bonding interface at the time of adhesion, with the photosensitive adhesive film 56 being cured and the photosensitive adhesive film 78 being uncured. The uncured photosensitive adhesive film 78 may better conform to the shape of the cured photosensitive adhesive film 56 during placement. When the photosensitive adhesive films 56 and 78 are pressed together, they intermingle and form polymer bonds to become one continuous PSPL. As compared to other bonding techniques such as hybrid bonding and fusion bonding, using the photosensitive adhesive films 56 and 78 allows the integrated circuit devices 50 to be adhered to the wafer 70 with less annealing and cleaning processes, reducing manufacturing costs.

After the integrated circuit devices 50 are attached to the wafer 70, air gaps 104 are formed in a region between the reflowable layers 62 and 84. The integrated circuit devices 50 are therefore physically connected to the wafer 70, but may not be electrically connected. The air gaps 104 include the regions bounded by the gaps $G_1$ and $G_2$ (shown in FIGS. 2B and 4B, respectively). The air gaps 104 each have two widths: one defined by the width $W_1$ of the openings 58 and one defined by the width $W_2$ of the openings 80. The air gaps 104 also each have a height $H_1$ equal to the sum of the heights of the gaps $G_1$ and $G_2$, which is also equal to Equation 1.

$$H_1=(T_1+T_3)-(T_2+T_4). \quad (1)$$

In FIGS. 6A and 6B, a reflow process is performed, thereby reforming the reflowable layers 62 and 84 into the conductive connector 102. The conductive connector 102 includes the material of the reflowable layers 62 and 84, and an intermetallic compounds (IMCs) may be formed at interfaces of the conductive connector 102 and the conductive layers 60 and 82. During the reflow process, the material of the reflowable layers 62 and 84 may change in shape due to surface tensions of the reflowed material. The new shapes of the reflowable layers 62 and 84 merge such that the reflowable layers 62 and 84 contact and form the conductive connector 102. Air gaps 106 remain, corresponding to the gaps $G_2$. The air gaps 106 are formed around an upper portion of the conductive connector 102, and a lower portion of the conductive connector 102 is disposed between the air gaps 106 and the connectors 76. Forming the air gaps 106 creates a buffering space between adjacent conductive connectors 102, allowing the conductive connector 102 to be formed with a finer pitch. In embodiments where the photosensitive adhesive film 78 is not immediately cured after formation, the heat from the reflow process may also cure the photosensitive adhesive film 78.

Figure 7:
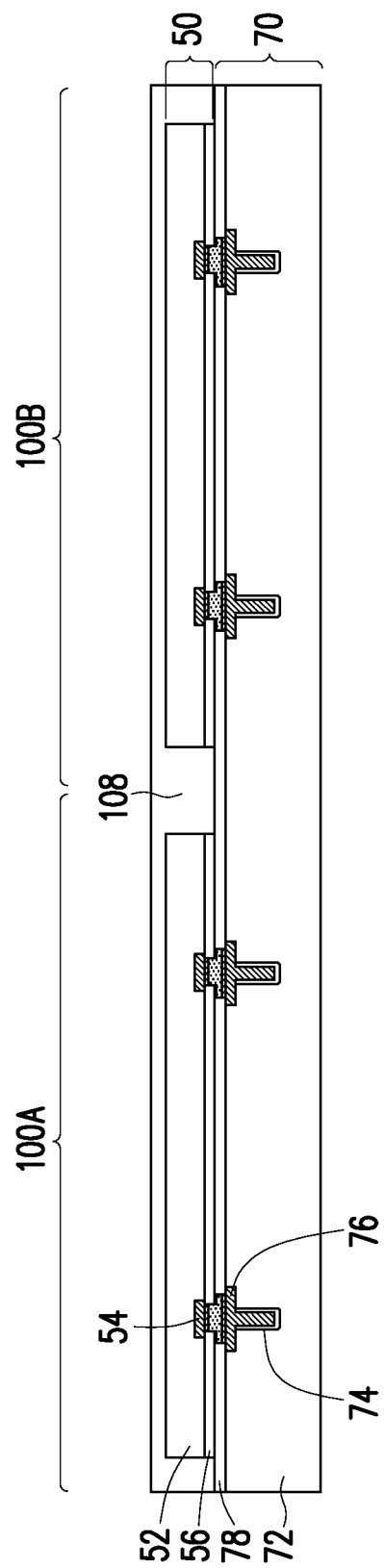

In FIG. 7, an encapsulant 108 is formed on the various components. The encapsulant 108 may be a molding compound, epoxy, or the like, and may be applied by compression molding, transfer molding, or the like. The encapsulant 108 may be formed over the wafer 70 such that the integrated circuit devices 50 are buried or covered. The encapsulant 108 is also formed on the photosensitive adhesive film 78. The encapsulant 108 is then cured. In some embodiments, the encapsulant 108 is thinned such that top surfaces of the encapsulant 108 and integrated circuit devices 50 are level.

Figure 8:
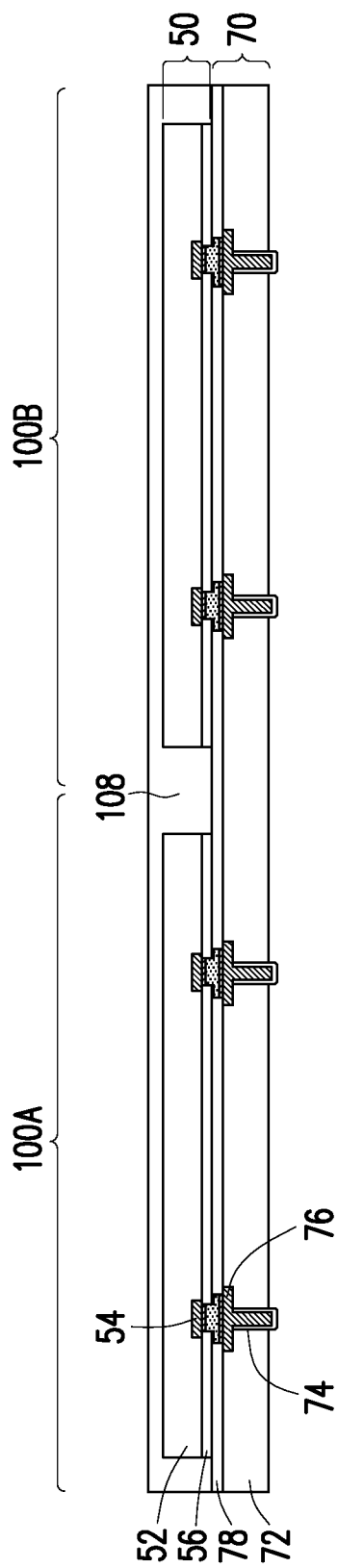

In FIG. 8, the substrate 72 is thinned to expose the through vias 74 such that the through vias 74 protrude from the back side of the substrate 72. Exposure of the through vias 74 may be accomplished in a two-step thinning process. First, a grinding process may be performed until the through vias 74 are exposed. The grinding process may be, e.g., a CMP or other acceptable removal process. After the grinding process, the back side of the substrate 72 and the through vias 74 may be level. Second, a recessing process may be performed to recess the substrate 72 around the through vias 74. The recessing process may be, e.g., a suitable etch-back process. During the thinning, some portions of the conductive material 74b may also be removed.

Figure 9:
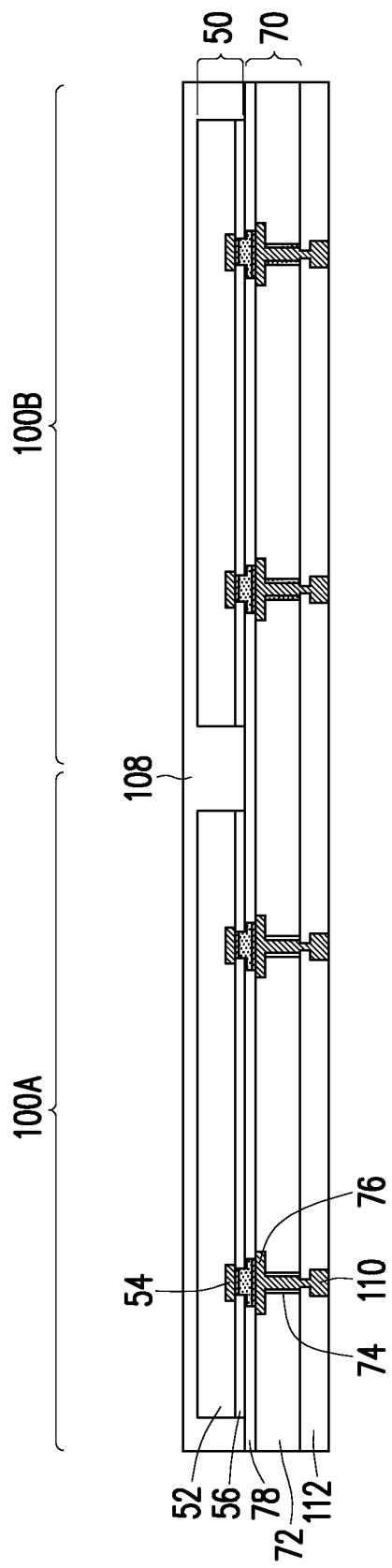

In FIG. 9, conductive pillars 110 are formed on the protruding portions of the through vias 74. The conductive pillars 110 may be formed by, e.g., a suitable photolithography and plating process, and may be formed from copper, aluminum, tungsten, silver, combinations thereof, or the like. An insulating layer 112 is then formed on the back side of the substrate 72, surrounding the protruding portions of the through vias 74 and the conductive pillars 110. In some embodiments, the insulating layer 112 is formed from a silicon-containing insulator, such as, silicon nitride, silicon oxide, silicon oxynitride, or the like, and may be formed by a suitable deposition method such as spin coating, CVD, PECVD, HDP-CVD, or the like. After deposition, a planarization process such as a CMP may be performed to remove excess dielectric material such that surfaces of the insulating layer 112 and conductive pillars 110 are level.

In some embodiments, the insulating layer 112 includes multiple layers. A first insulating layer may be formed on the on the back side of the substrate 72, surrounding the protruding portions of the through vias 74. The first insulating layer is patterned with openings exposing the through vias 74. A seed layer is formed on the first insulating layer and in the openings, and a photoresist is formed on the seed layer. The photoresist is patterned with openings corresponding to the pattern of the conductive pillars 110, and a plating process is performed, thereby forming the conductive pillars 110 in the openings. The photoresist and exposed portions of the seed layer are removed. A second insulating layer is then formed on the first insulating layer and around the conductive pillars 110.

Figure 10:
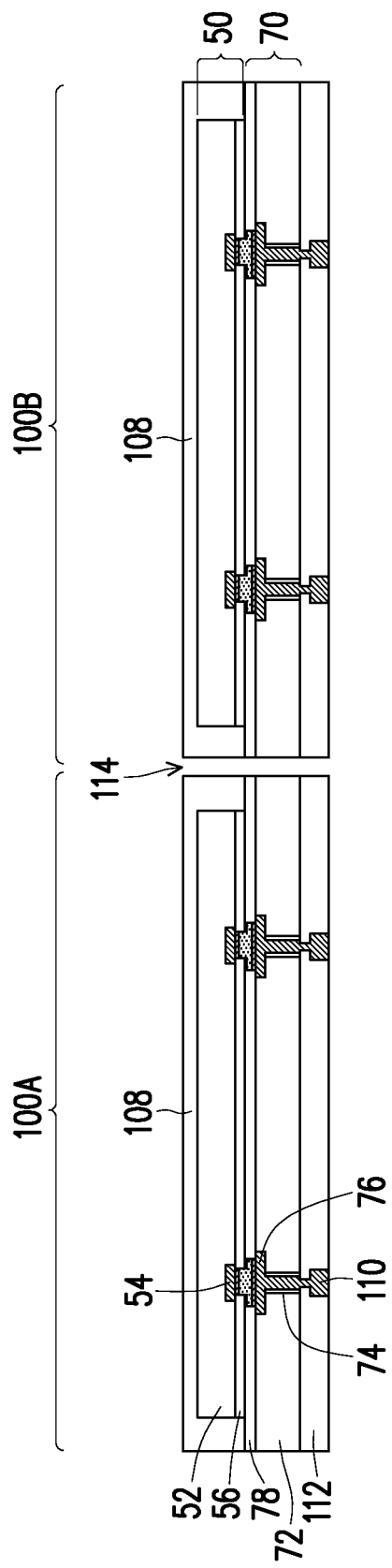

In FIG. 10, the wafer 70 is singulated between adjacent device regions 100A and 100B along scribe line regions 114 to form intermediate packages 100. The singulation may be by sawing, dicing, or the like.

Figure 11:
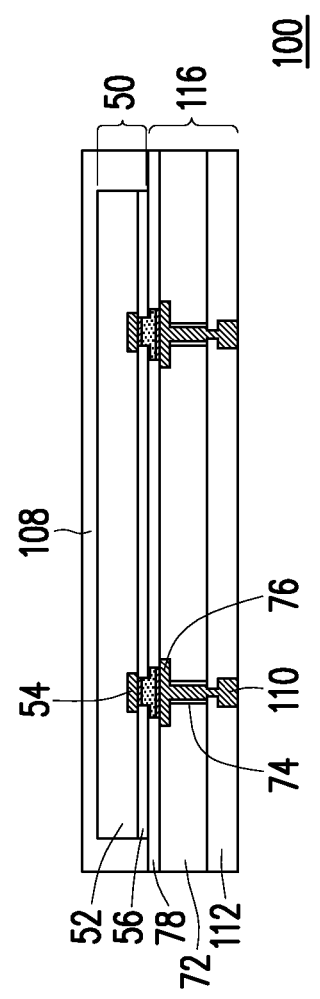

FIG. 11 shows an intermediate package 100 after singulation. During the singulation process, interposers 116 are formed, which include singulated portions of the wafer 70 and insulating layer 112. In some embodiments, the interposers 116 are free of active devices. In other embodiments, the interposers 116 include active devices. Each of the intermediate packages 100 includes an interposer 116. Singulated portions of the photosensitive adhesive film 78 are on the interposers 116. As a result of the singulation process, edges of the interposers 116, encapsulant 108, and photosensitive adhesive film 78 are coterminous. In other words, the outer sidewalls of the interposers 116 have the same width as the outer sidewalls of the encapsulant 108 and photosensitive adhesive film 78.

Figure 12:
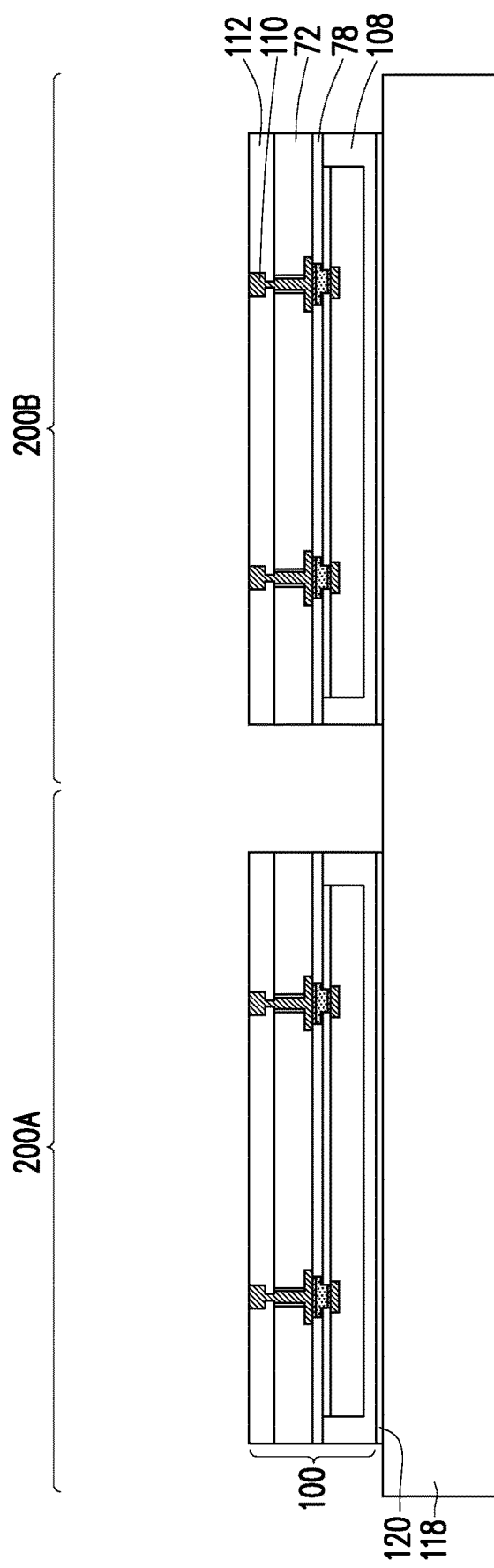

In FIG. 12, the singulated intermediate packages 100 are adhered to a carrier substrate 118. The carrier substrate 118 may be a glass carrier substrate, a ceramic carrier substrate, or the like. The carrier substrate 118 may be a wafer, such that multiple packages can be formed on the carrier substrate 118 simultaneously. The carrier substrate 118 includes multiple device regions 200A and 200B, in which the intermediate packages 100 are attached by an adhesive 120.

The adhesive 120 is on back-sides of the intermediate packages 100 and adheres the intermediate packages 100 to the carrier substrate 118. The adhesive 120 may be any suitable adhesive, epoxy, die attach film (DAF), or the like. The adhesive 120 may be applied to a back-side of the intermediate packages 100, such as to a back-side of the respective encapsulant 108 or may be applied over the surface of the carrier substrate 118. The intermediate packages 100 may be adhered to the carrier substrate 118 by the adhesive 120 using, for example, a pick-and-place tool.

Figure 13:
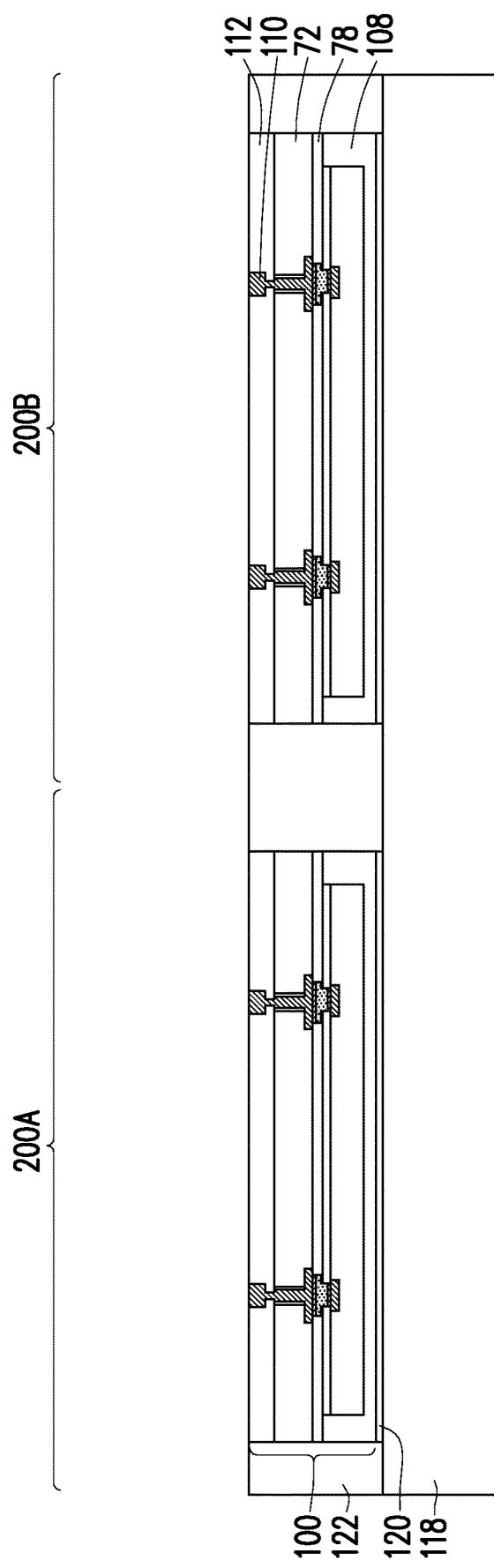

In FIG. 13, an encapsulant 122 is formed on the various components. The encapsulant 122 may be a molding compound, epoxy, or the like, and may be applied by compression molding, transfer molding, or the like. The encapsulant 122 may be formed over the intermediate packages 100 such that the conductive pillars 110 are buried or covered. After curing, the encapsulant 122 can undergo a grinding process to expose the conductive pillars 110. The grinding process may also grind the insulating layer 112. Top surfaces of the conductive pillars 110, insulating layer 112, and encapsulant 122 are coplanar after the grinding process. The grinding process may be, for example, a chemical-mechanical polish (CMP). In some embodiments, the grinding may be omitted, for example, if the conductive pillars 110 are already exposed.

Figure 14:
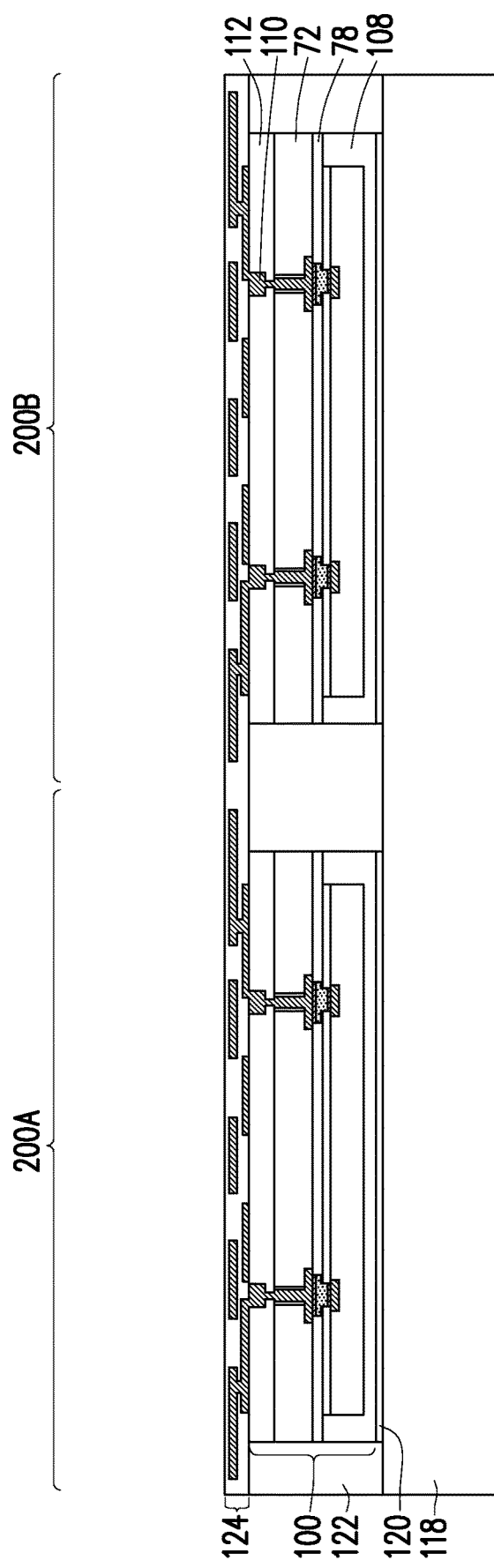

In FIG. 14, a redistribution structure 124 is formed on the encapsulant 122 and intermediate packages 100. The redistribution structure 124 includes multiple dielectric layers and metallization patterns. It should be appreciated that the illustration of the redistribution structure 124 is schematic. For example, the redistribution structure 124 may be patterned as a plurality of discrete portions separated from each other by respective dielectric layer(s). The redistribution structure 124 may be, e.g., redistribution layers (RDLs), and may include metal traces (or metal lines) and vias underlying and connected to the metal traces. As an example of forming the redistribution structure 124, each respective dielectric layer may be deposited, and openings may be formed in the deposited dielectric layer. The metal traces and vias may be formed on the deposited dielectric layer and in the openings by, e.g., acceptable photolithography and plating processes.

Figure 15:
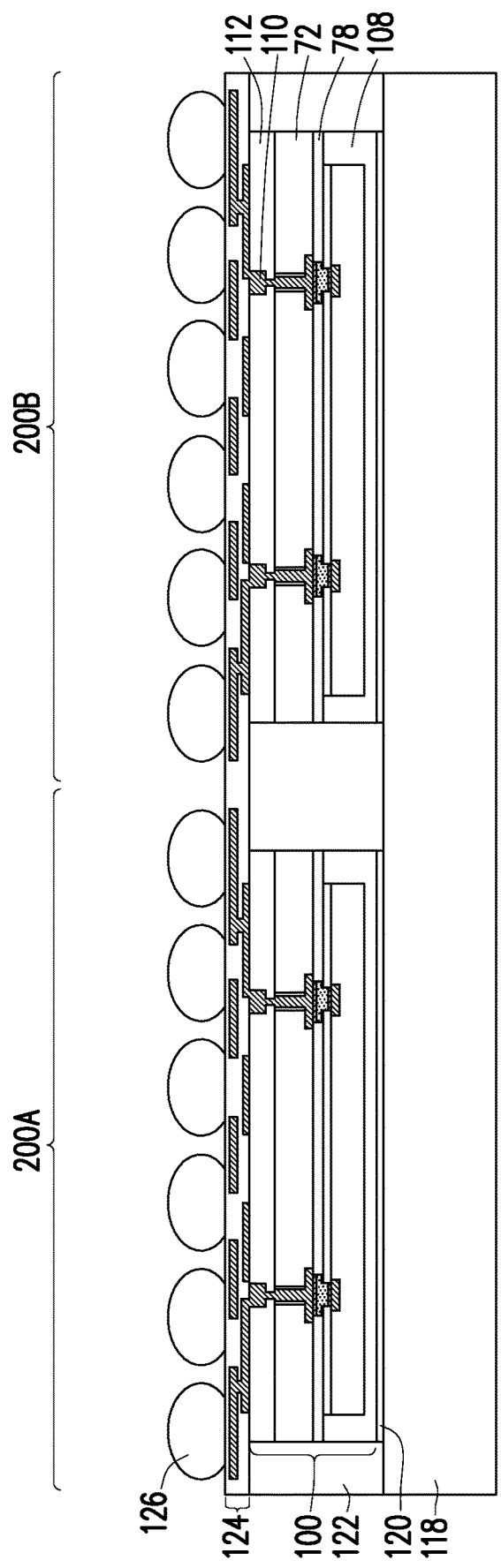

In FIG. 15, conductive connectors 126 are formed connected to the redistribution structure 124. The conductive connectors 126 may be formed on pads on an exterior side of the redistribution structure 124. The pads are formed to contact metallization patterns in the redistribution structure 124, and may be referred to as under bump metallurgies (UBMs). The conductive connectors 126 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 126 may include a conductive material such as solder, copper, aluminum, gold, nickel, silver, palladium, tin, the like, or a combination thereof. In some embodiments, the conductive connectors 126 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 126 are metal pillars (such as a copper pillar) formed by a sputtering, printing, electro plating, electroless plating, CVD, or the like. The metal pillars may be solder free and have substantially vertical sidewalls.

Figure 16:
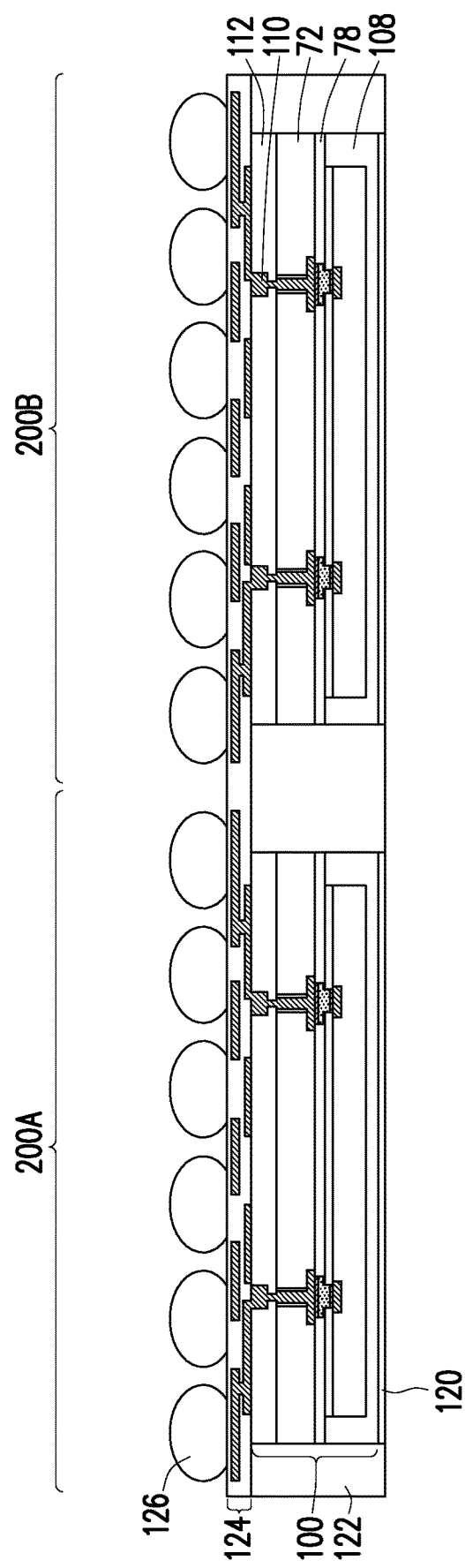

In FIG. 16, a carrier substrate de-bonding is performed to detach (de-bond) the carrier substrate 118 from the back side of the encapsulant 122 and intermediate packages 100. In accordance with some embodiments, the de-bonding includes projecting a light such as a laser light or an UV light on the adhesive 120 so that the adhesive 120 decomposes under the heat of the light and the carrier substrate 118 can be removed.

Figure 17:
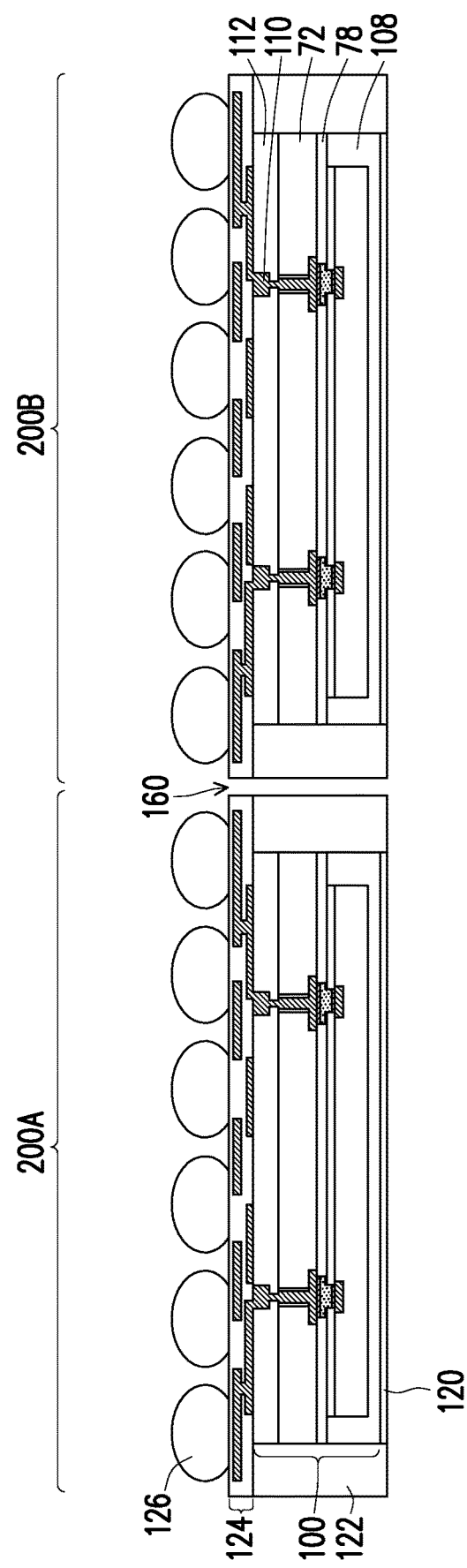

In FIG. 17, the adjacent device regions 200A and 200B are singulated along scribe line regions 160 to form the device packages 200. The singulation may be by sawing, dicing, or the like. FIG. 18 shows a resulting device package 200 after singulation.

In FIG. 19, a device package 300 is formed by mounting the device package 200 to a package substrate 202. In an embodiment, the device package 300 is a chip-on-wafer-on-substrate (CoWoS) package, although it should be appreciated that embodiments may be applied to other 3DIC packages.

The package substrate 202 may be made of a semiconductor material such as silicon, germanium, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 202 may be a SOI substrate. Generally, an SOI substrate includes a layer of a semiconductor material such as epitaxial silicon, germanium, silicon germanium, SOI, SGOI, or combinations thereof. The package substrate 202 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 202.

The package substrate 202 may include active and passive devices. As one of ordinary skill in the art will recognize, a wide variety of devices such as transistors, capacitors, resistors, combinations of these, and the like may be used to generate the structural and functional requirements of the design for the device package 200. The devices may be formed using any suitable methods. In some embodiments, the package substrate 202 is substantially free of active and passive devices.

The package substrate 202 may also include metallization layers and vias and bond pads over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like).

The conductive connectors 126 are reflowed to attach the device package 200 to the package substrate 202. The conductive connectors 126 electrically and physically couple the package substrate 202, including metallization layers in the package substrate 202, to the device package 200. An underfill 204 may be formed between the device package 200 and package substrate 202, surrounding the conductive connectors 126. The underfill 204 may be formed by a capillary flow process after the device package 200 is attached or may be formed by a suitable deposition method before the device package 200 is attached.

In some embodiments, conductive connectors 206 are formed on the package substrate 202, on a side opposite that of the conductive connectors 126. The conductive connectors 206 may be, e.g., BGA connectors, and may include a conductive material such as solder, copper, aluminum, gold, nickel, silver, palladium, tin, the like, or a combination thereof.

Figure 20:
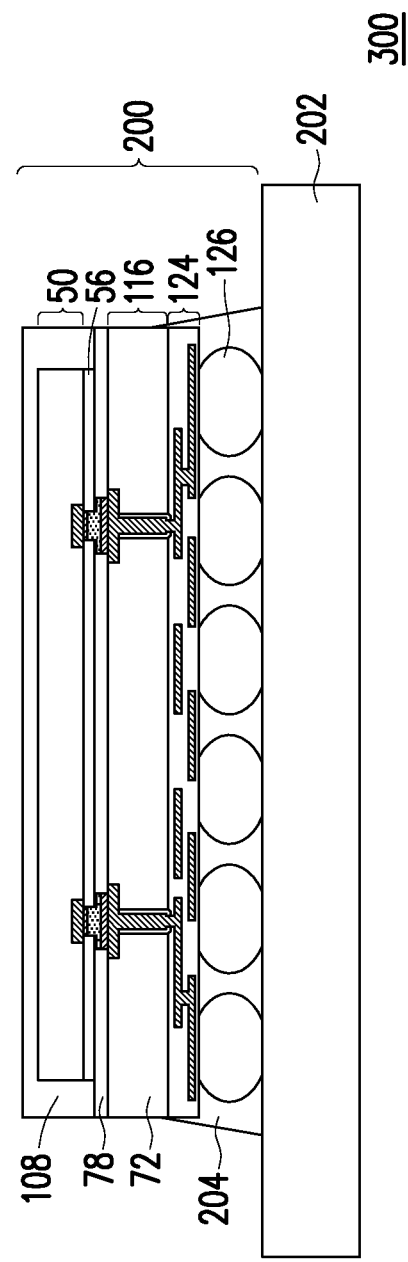
FIG. 20 shows a device package, in accordance with some other embodiments.
Figure 21:
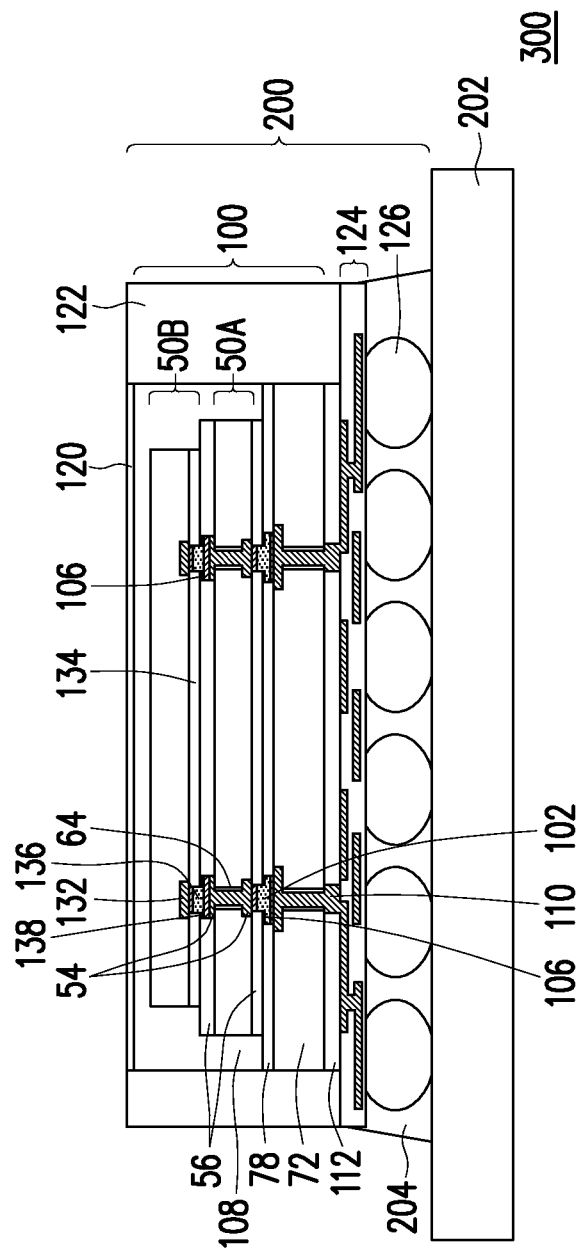
FIG. 21 shows a device package, in accordance with yet other embodiments.

It should be appreciated that the device package 300 may be formed with other variations. FIG. 20 shows the device package 300, in accordance with some other embodiments. FIG. 21 shows the device package 300, in accordance with yet other embodiments.

In the embodiment of FIG. 20, the intermediate packages 100 are not separately singulated and adhered to the carrier substrate 118. Rather, the redistribution structure 124 is formed on the wafer 70 after the through vias 74 are exposed. The conductive pillars 110, insulating layer 112, and encapsulant 122 may be omitted, and the redistribution structure 124 may be formed directly on the wafer 70, e.g., the bottom dielectric layer of the redistribution structure 124 may physically contact the substrate 72. The wafer 70 and redistribution structure 124 are then simultaneously singulated to form the device packages 200.

In the embodiment of FIG. 21, the intermediate packages 100 are formed to include multiple stacked integrated circuit devices 50, such as first and second integrated circuit devices 50A and 50B. For example, the first integrated circuit device 50A may be formed to include connectors 54 on both sides, and through vias 64 may be formed between the connectors 54. The photosensitive adhesive film 56 may be formed on both sides of the first integrated circuit device 50A. The second integrated circuit device 50B may include connectors 132 and a photosensitive adhesive film 134, and may be adhered to the first integrated circuit device 50A. Additional conductive connectors 136 having air gaps 138 are formed between the connectors 54 and 132. More or less integrated circuit devices 50 may be stacked in the intermediate packages 100.

Additional processes for forming device packages will now be illustrated, in accordance with some embodiments. Some features of the subsequent processes and devices may be formed in similar manner as similarly-named features discussed above. As such, details of formation are not repeated herein.

FIGS. 22 through 33 are various views of intermediate steps during a process for forming device packages 500, in accordance with some embodiments. In the description of the following embodiments, like reference numbers indicate like reference numbers from the previously described embodiments. In FIGS. 22 through 27, intermediate packages 400 are formed by bonding the integrated circuit devices 50 to the front side of the wafer 70. The intermediate packages 400 are singulated. In FIGS. 28 through 33, further processing is performed to form the device packages 500. FIGS. 22 through 33 are cross-sectional views, where figures ending with an "A" designation show an overall view and figures ending with a "B" designation show a detailed view of a region $R_4$ from the corresponding "A" figure.

Figure 22:
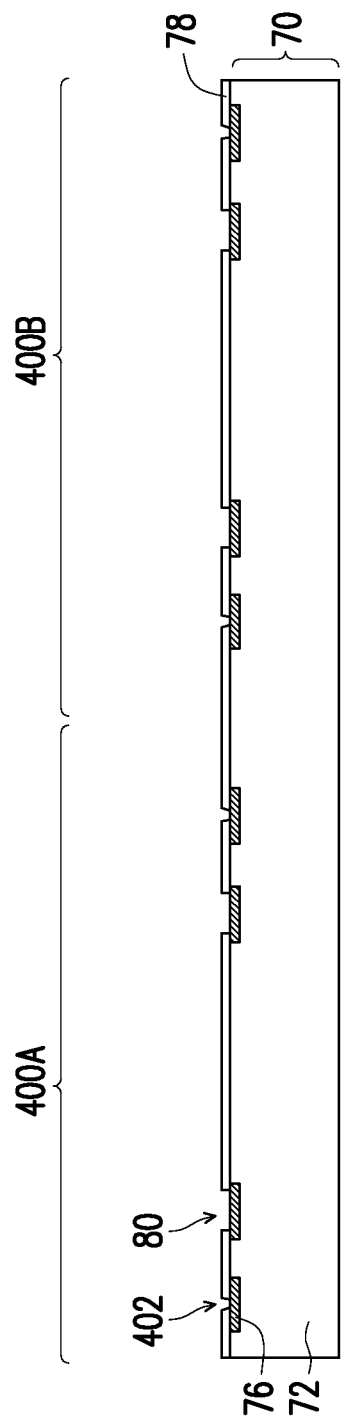

In FIG. 22, the photosensitive adhesive film 78 is patterned to form openings 402 exposing some of the connectors 76. The openings 402 may be patterned concurrently with the patterning of the openings 80. The openings 80 and 402 may be a same size, or may be different sizes.

Figure 23A:
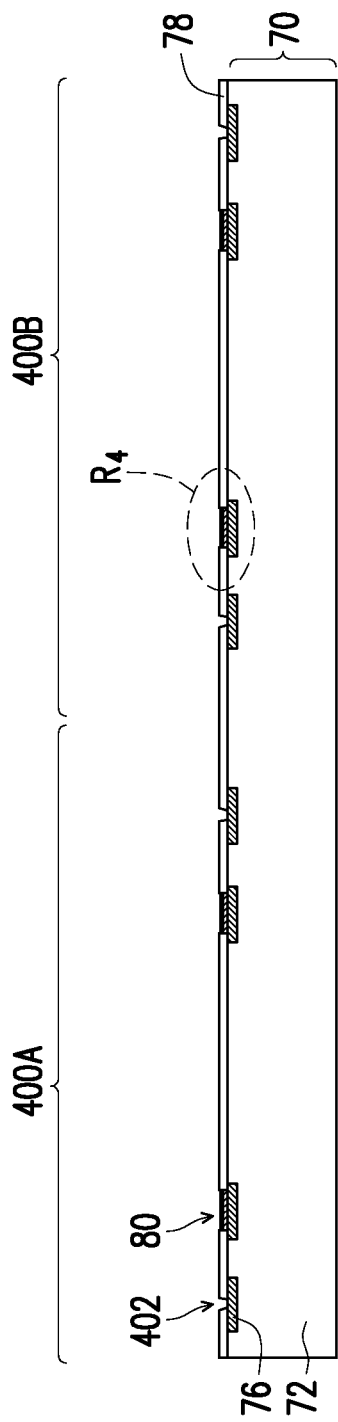
Figure 23B:
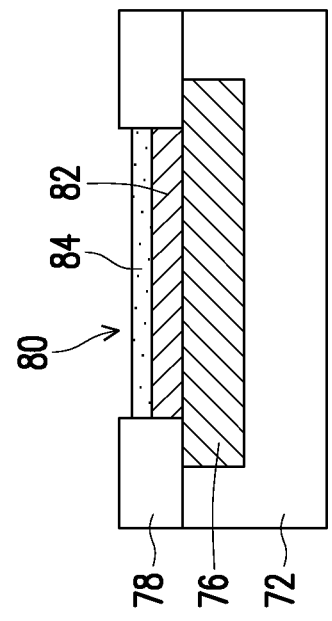

In FIGS. 23A and 23B, the conductive layers 82 are formed in the openings 80 on the connectors 76. The reflowable layers 84 are then formed on the conductive layers 82 in the openings 80. The conductive layers 82 and reflowable layers 84 are formed in the openings 80, and are not formed in the openings 402.

Figure 24:
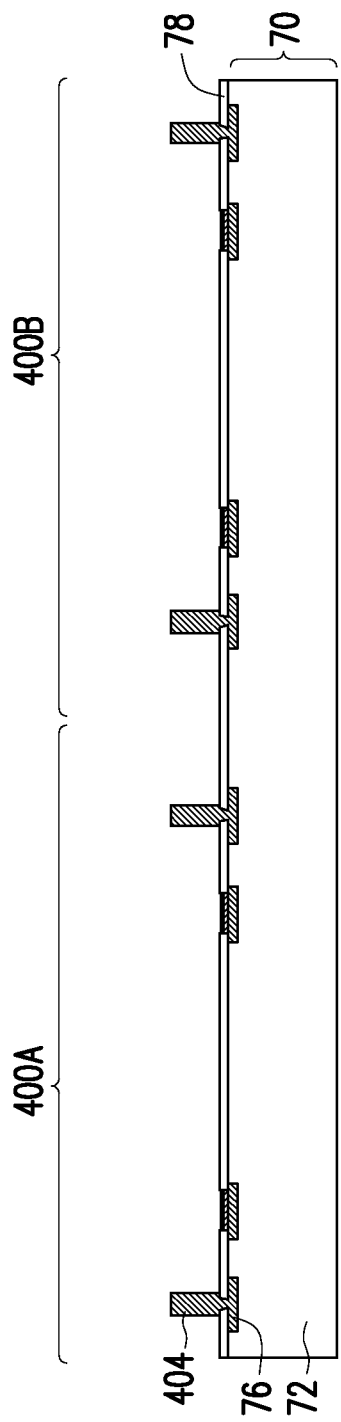

In FIG. 24, through vias 404 are formed. As an example to form the through vias 404, a seed layer is formed over the photosensitive adhesive film 78 and in the openings 402. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to through vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 404. The through vias 404 may be formed symmetrically or asymmetrically around each of the integrated circuit devices 50.

In FIGS. 25A and 25B, a plurality of the integrated circuit devices 50 are attached to the wafer 70. Before being attached, the integrated circuit devices 50 may be processed as described herein. For example, connectors 54 are formed on the active side of the integrated circuit devices 50, and vias 64 may be formed in the integrated circuit devices 50. The photosensitive adhesive film 56 is formed on the integrated circuit devices 50 and patterned. The integrated circuit devices 50 are then bonded to the wafer 70 in a face-to-face manner, using the photosensitive adhesive films 56 and 78 as adhesives, and a reflow process to form the conductive connectors 102 surrounded by air gaps 106.

Figure 26:
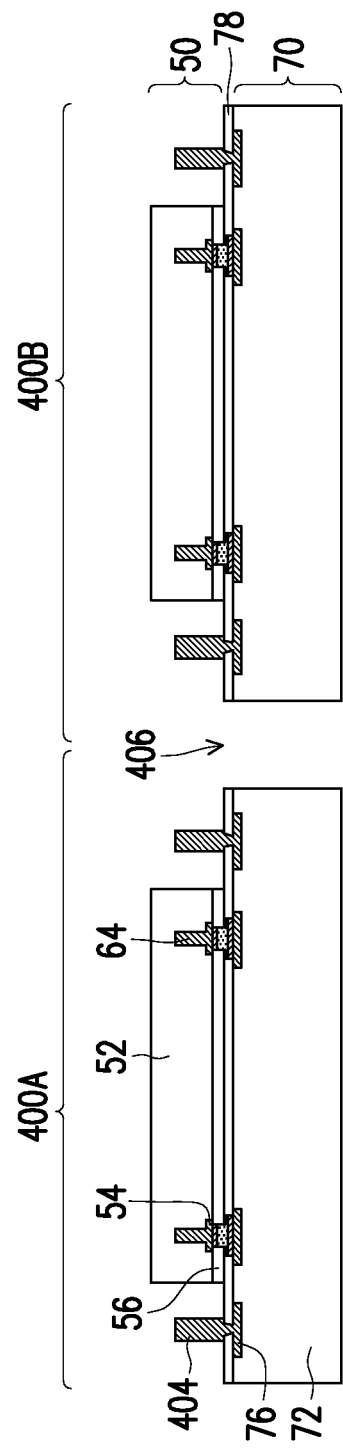
Figure 27:
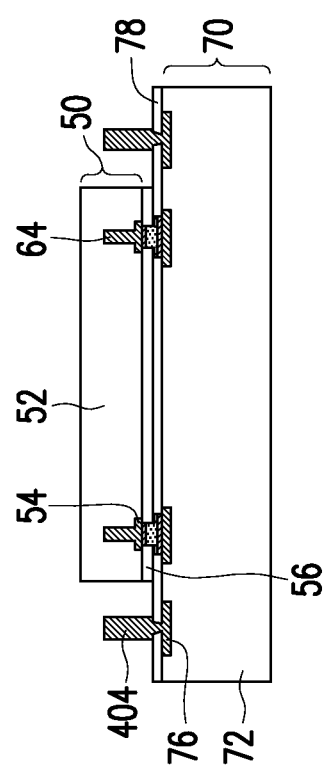

In FIG. 26, the wafer 70 is singulated between adjacent device regions 400A and 400B along scribe line regions 406 to form intermediate packages 400. The singulation may be by sawing, dicing, or the like. FIG. 27 shows an intermediate package 400 after singulation.

Figure 28:
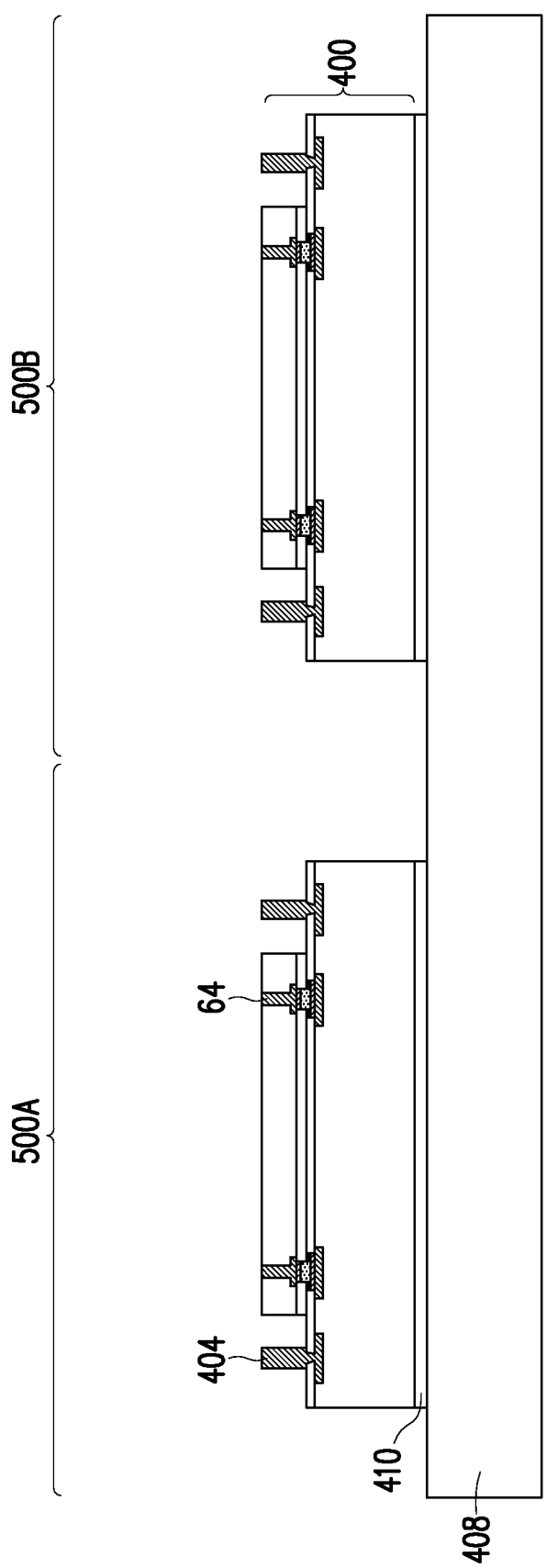

In FIG. 28, the singulated intermediate packages 400 are adhered to a carrier substrate 408. The carrier substrate 408 may be similar to the carrier substrate 118. The carrier substrate 408 includes multiple device regions 500A and 500B, in which the intermediate packages 400 are attached by an adhesive 410. The adhesive 410 is on back-sides of the intermediate packages 400.

Figure 29:
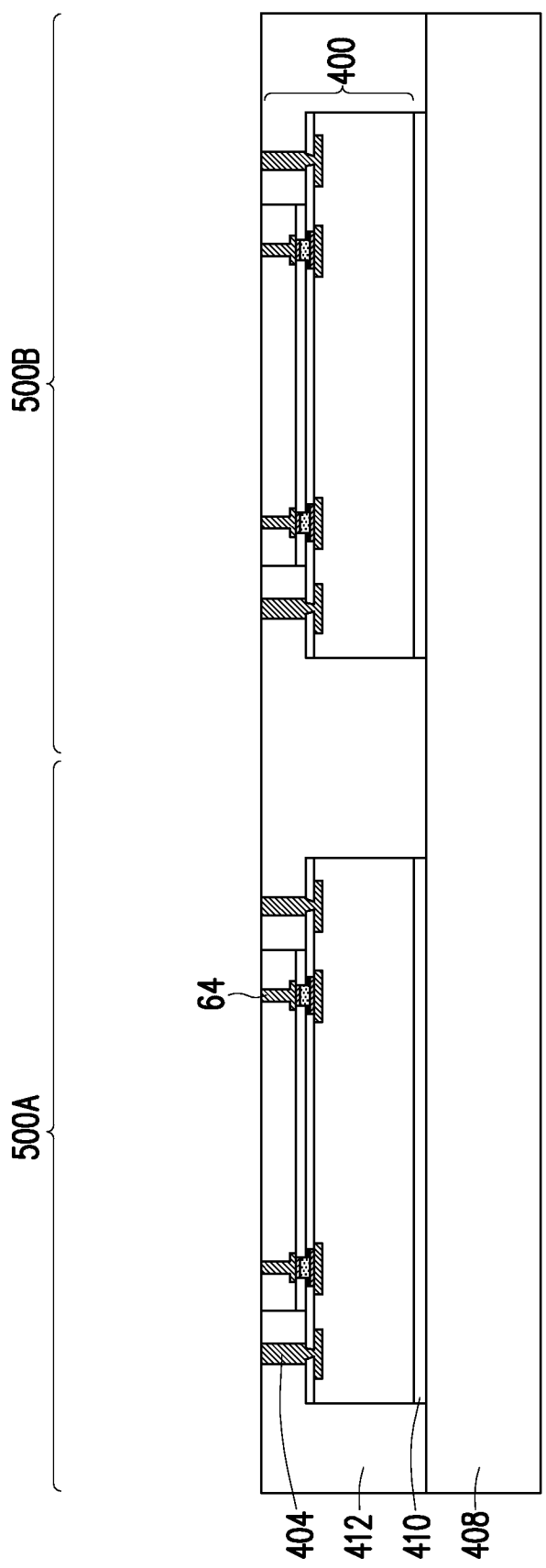

In FIG. 29, an encapsulant 412 is formed on the various components. The encapsulant 412 may be similar to the encapsulant 122. The encapsulant 412 may be formed over the intermediate packages 400 such that the through vias 404 are buried or covered. After curing, the encapsulant 412 can undergo a grinding process to expose the through vias 64 and 404. Top surfaces of the through vias 64 and 404 and the encapsulant 412 are coplanar after the grinding process.

Figure 30:
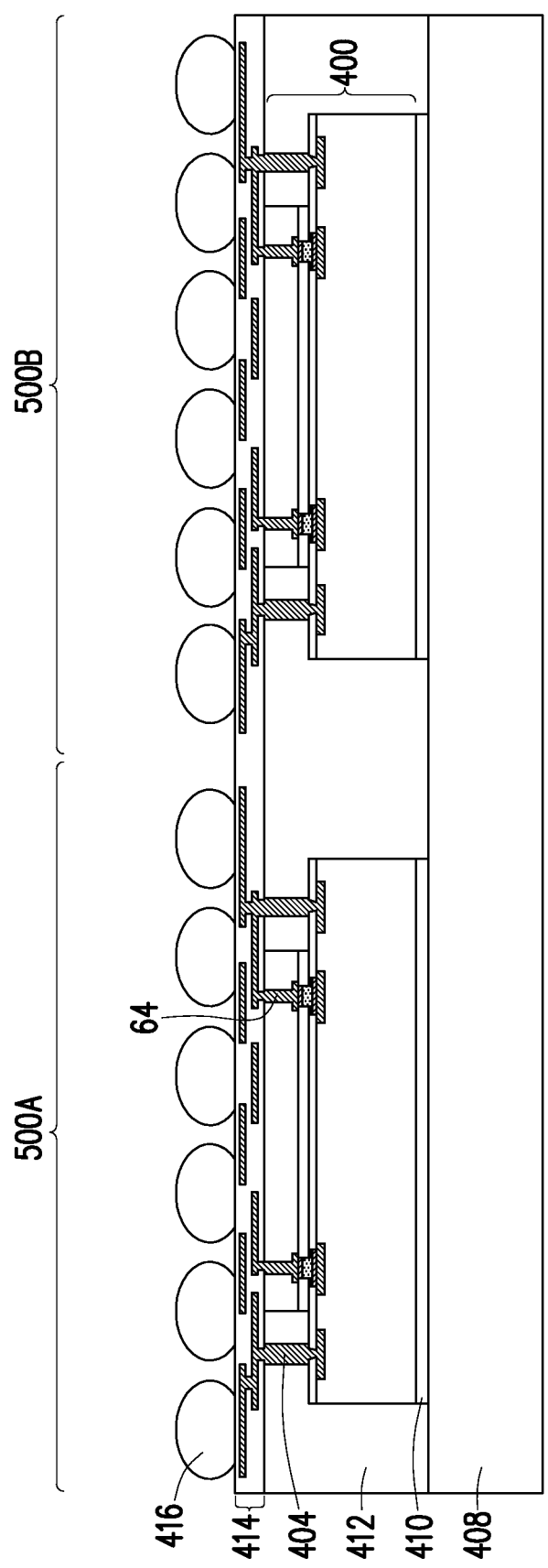

In FIG. 30, a redistribution structure 414 is formed on the encapsulant 412 and intermediate packages 100. The redistribution structure 414 may be similar to the redistribution structure 124. Conductive connectors 416 are then formed connected to the redistribution structure 414. The conductive connectors 416 may be similar to the conductive connectors 126.

Figure 31:
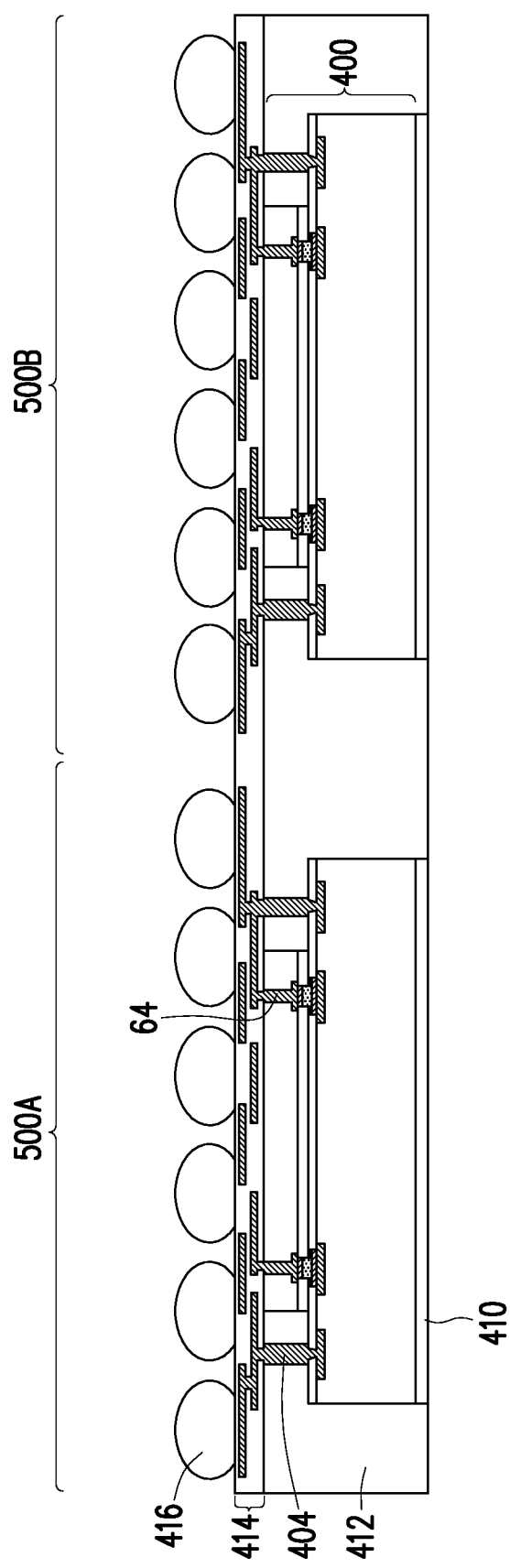

In FIG. 31, a carrier substrate de-bonding is performed to detach (de-bond) the carrier substrate 408 from the back side of the encapsulant 412 and intermediate packages 400.

Figure 32:
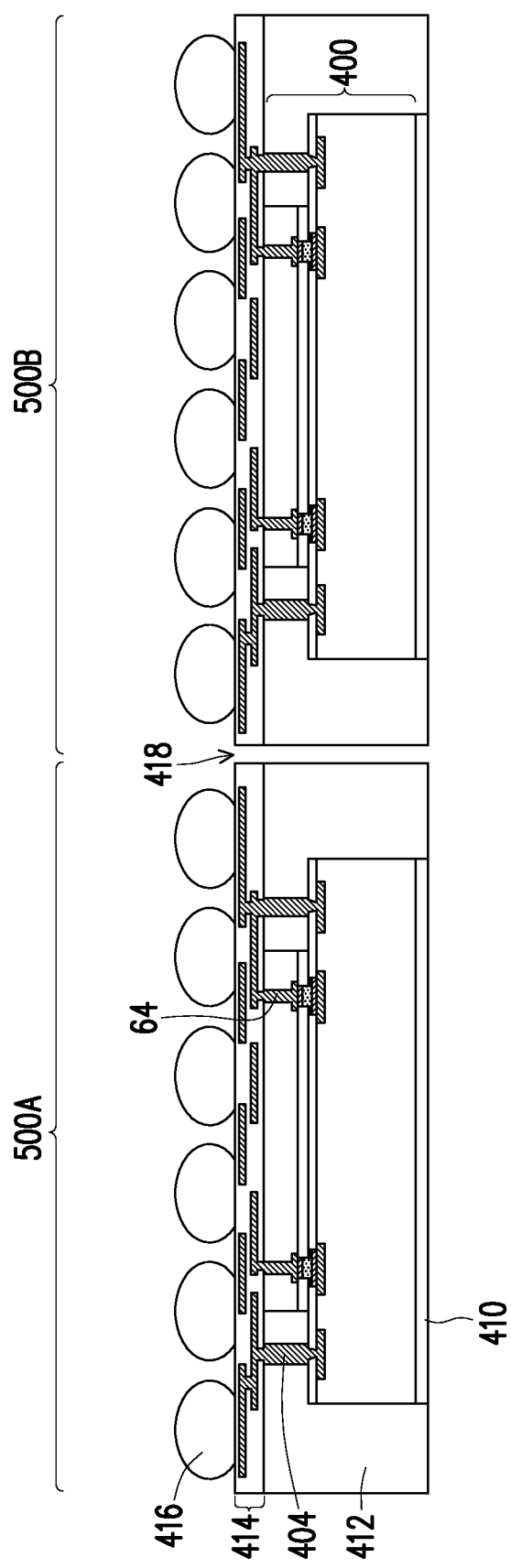
Figure 33:
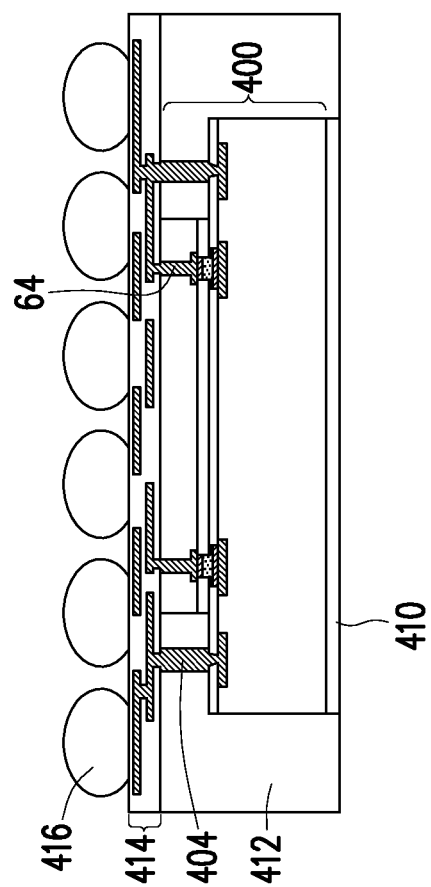

In FIG. 32, the adjacent device regions 500A and 500B are singulated along scribe line regions 418 to form the device packages 500. The singulation may be by sawing, dicing, or the like. FIG. 33 shows a resulting device package 500 after singulation.

Figure 34:
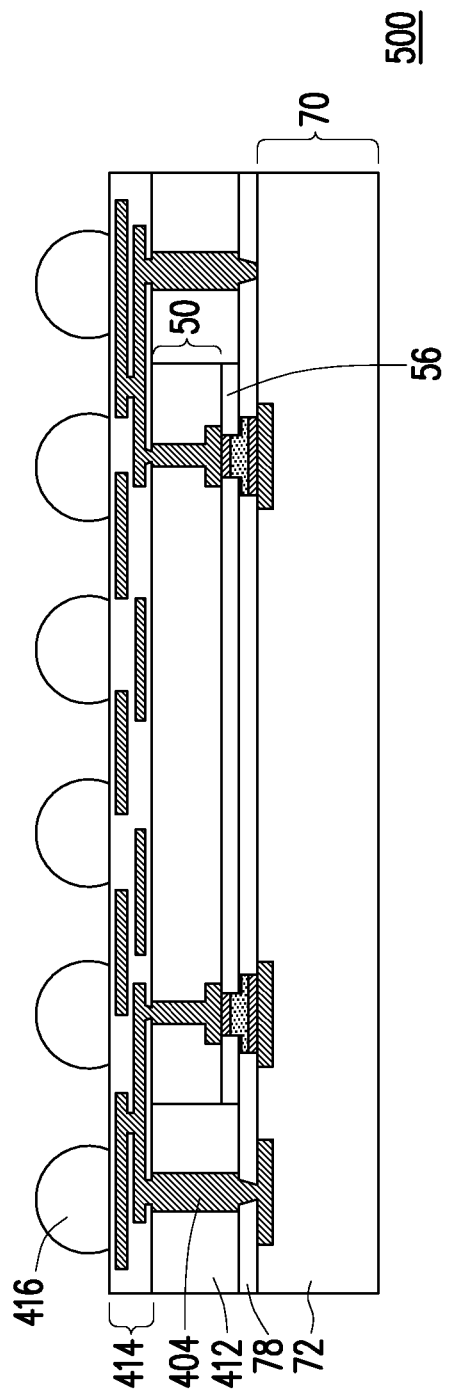
FIG. 34 shows a device package, in accordance with some other embodiments.
Figure 35:
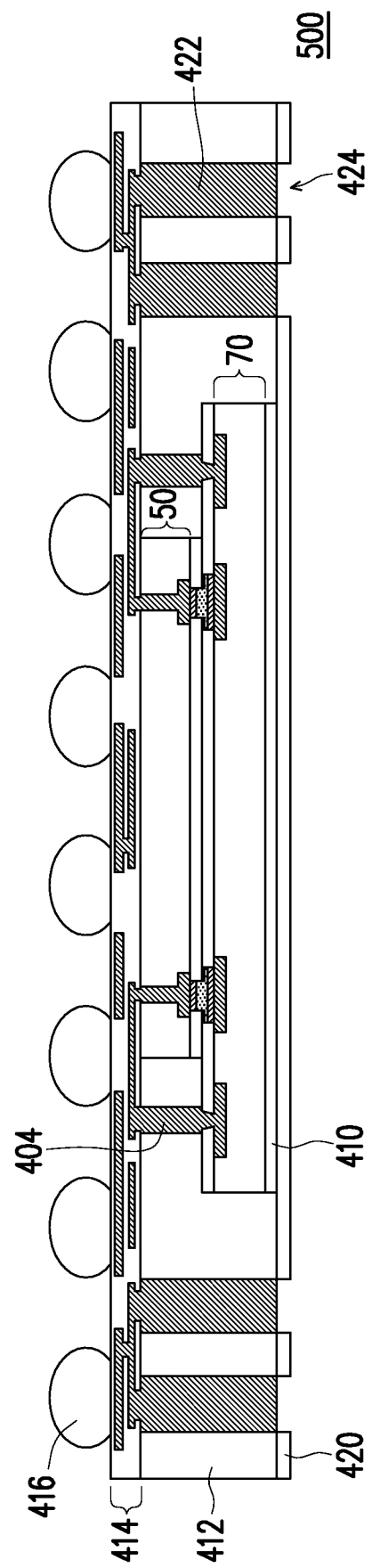
FIG. 35 shows a device package, in accordance with yet other embodiments.
Figure 36:
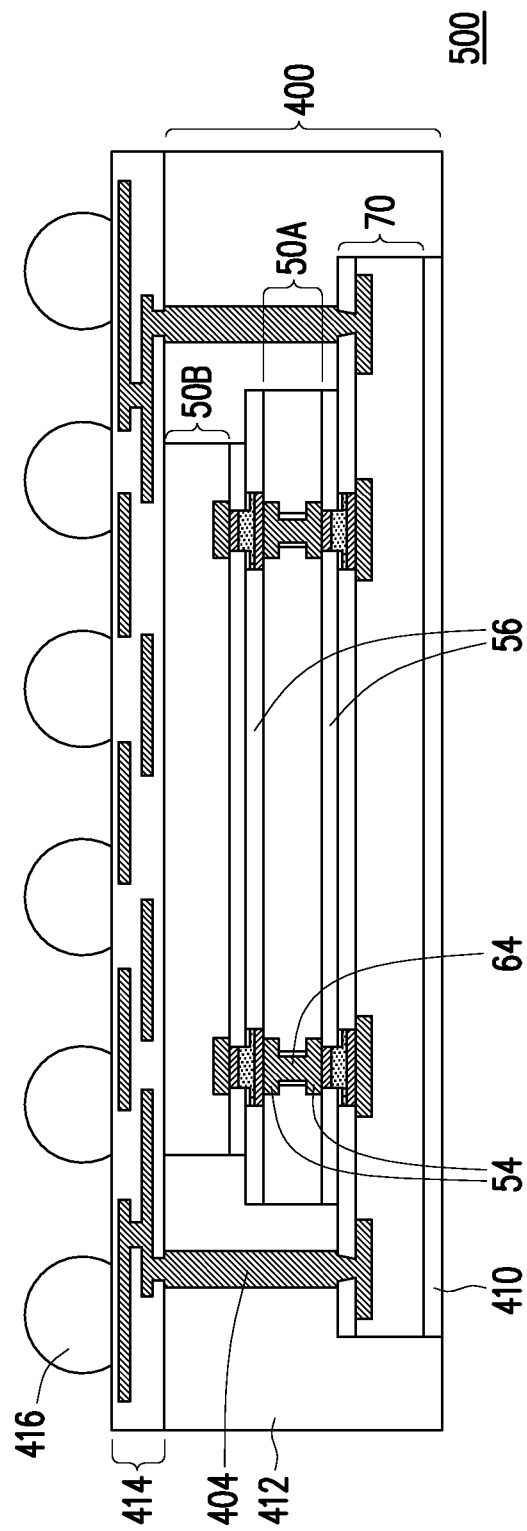
FIG. 36 shows a device package, in accordance with yet other embodiments.

It should be appreciated that the device package 500 may be formed with other variations. FIG. 34 shows the device package 500, in accordance with some other embodiments. FIG. 35 shows the device package 500, in accordance with yet other embodiments. FIG. 36 shows the device package 500, in accordance with yet other embodiments.

In the embodiment of FIG. 34, the intermediate packages 400 are not separately singulated and adhered to the carrier substrate 408. Rather, the encapsulant 412 is formed directly on the wafer 70, after the integrated circuit devices 50 are attached. The encapsulant 412 may bury the integrated circuit devices 50. The integrated circuit devices 50 and encapsulant 412 are then planarized, and the redistribution structure 414 is formed on the integrated circuit devices 50 and encapsulant 412. The wafer 70 and redistribution structure 414 are then simultaneously singulated to form the device packages 500.

The embodiment of FIG. 35 is similar to the embodiment of FIG. 34, but the intermediate packages 400 are placed on a dielectric layer 420 and encapsulated in an encapsulant 412. Through vias 422 may be formed through the encapsulant 412, adjacent the intermediate packages 400. The redistribution structure 414 is formed on the intermediate packages 400 and through vias 420. Openings 424 are formed in the dielectric layer 420, exposing the through vias 422.

The embodiment of FIG. 36 is similar to the embodiment of FIG. 34, except the intermediate packages 400 are formed to include multiple stacked integrated circuit devices 50, such as first and second integrated circuit devices 50A and 50B. Similar to other embodiments described herein, the through vias 64 may be formed in some of the stacked integrated circuit devices 50.

FIGS. 37 through 46 are various views of intermediate steps during a process for forming a device package 600, in accordance with some embodiments. In an embodiment, the device package 600 is an Integrated Fan-Out (InFO) package, although it should be appreciated that embodiments may be applied to other 3DIC packages. FIGS. 37 through 46 are cross-sectional views, where figures ending with an "A" designation show an overall view and figures ending with a "B" designation show a detailed view of a region $R_5$ from the corresponding "A" figure.

Figure 37:
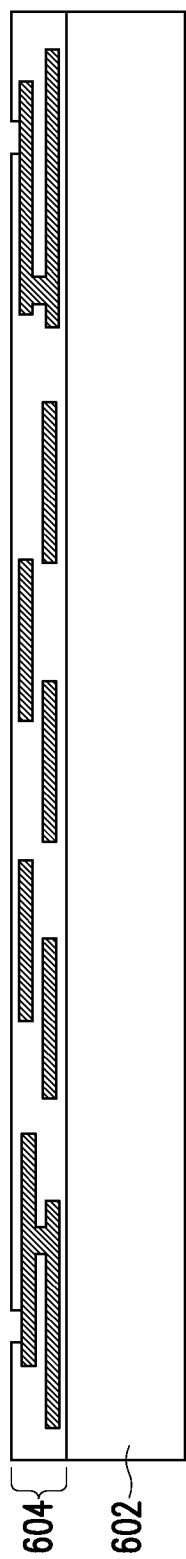

In FIG. 37, a carrier substrate 602 is provided, and a back-side redistribution structure 604 is formed on the carrier substrate 602. The back-side redistribution structure 604 includes multiple dielectric layers and metallization patterns. The back-side redistribution structure 604 may be formed in a similar manner as the back-side redistribution structure 124.

Figure 38:
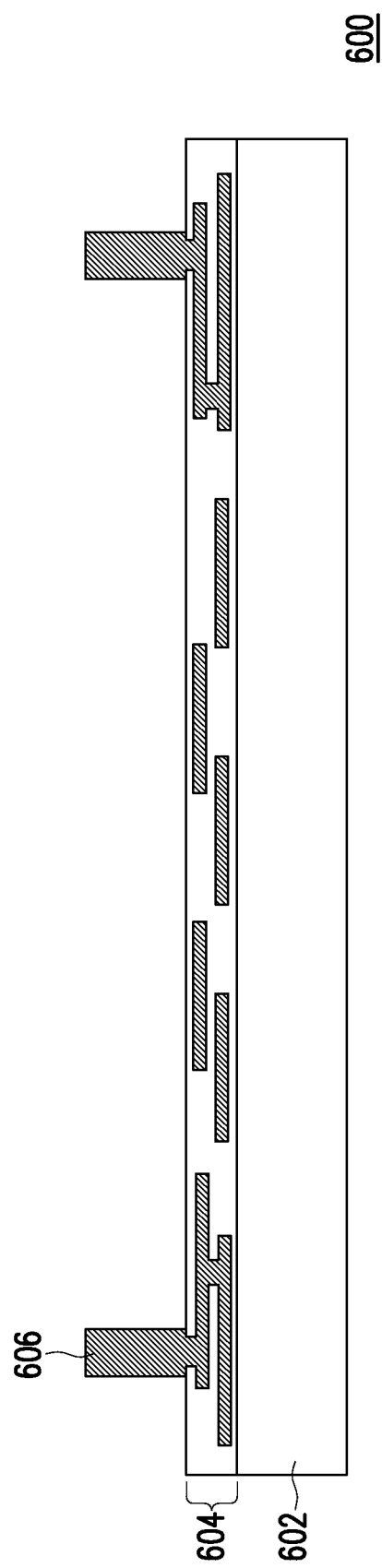

In FIG. 38, through vias 606 are formed on the back-side redistribution structure 604. The through vias 606 may be similar to the through vias 404.

Figure 39:
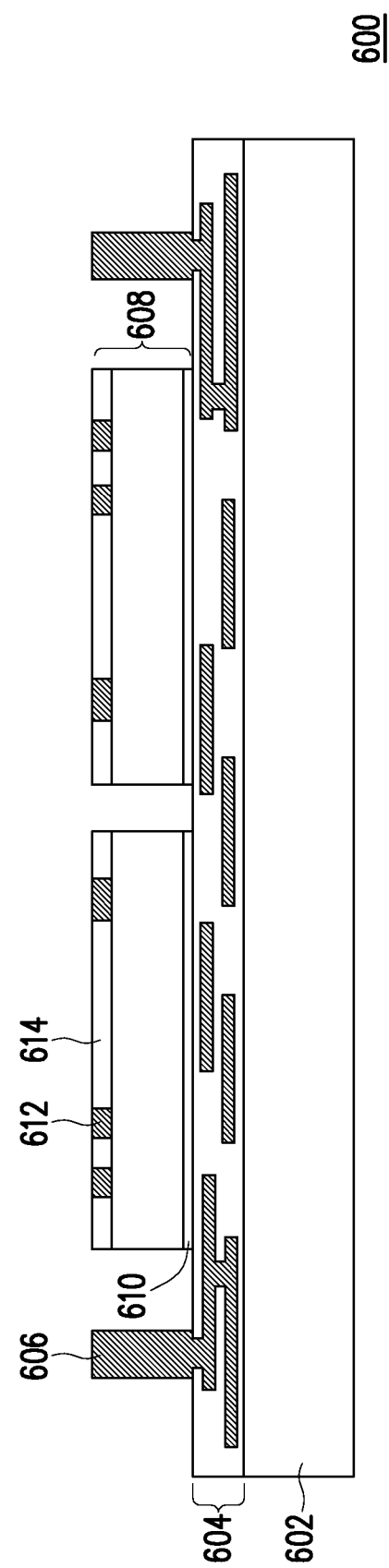

In FIG. 39, an integrated circuit die 608 is adhered to the back-side redistribution structure 604 by an adhesive 610. In other embodiments, more integrated circuit dies 608 may be adhered to the back-side redistribution structure 604. Die connectors 612, such as conductive pillars (for example, comprising a metal such as copper), are on the active side of the integrated circuit die 608, and a dielectric material 614 is on the active side of the integrated circuit die 608, around the die connectors 612.

Figure 40:
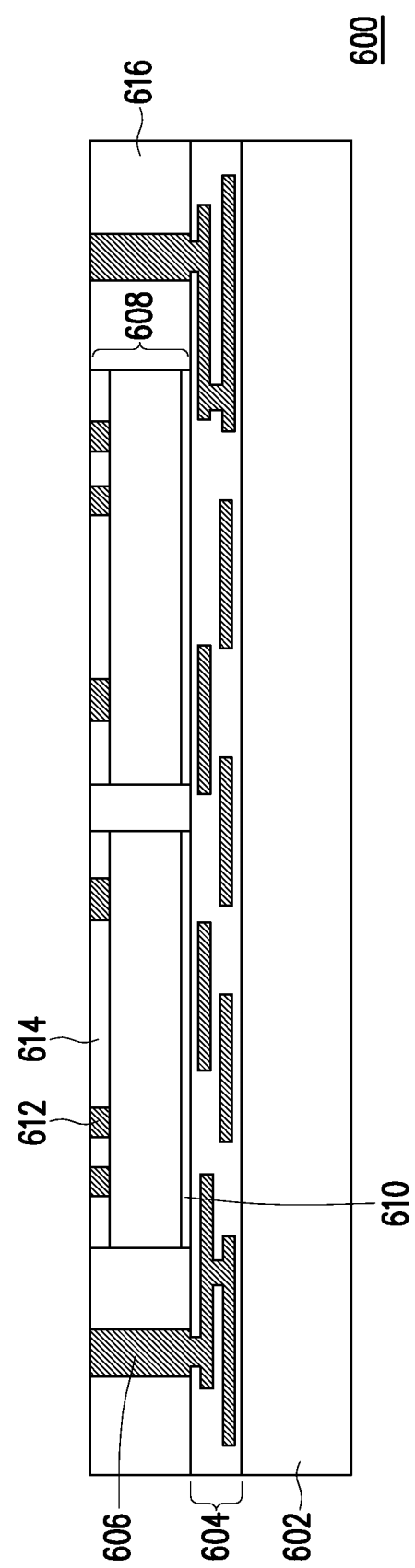

In FIG. 40, an encapsulant 616 is formed on and around the through vias 606 and integrated circuit die 608. The encapsulant 616 may be similar to the encapsulant 122. The encapsulant 616 may be planarized such that top surfaces of the through vias 606, die connectors 612, dielectric material 614, and encapsulant 616 are level.

Figure 41:
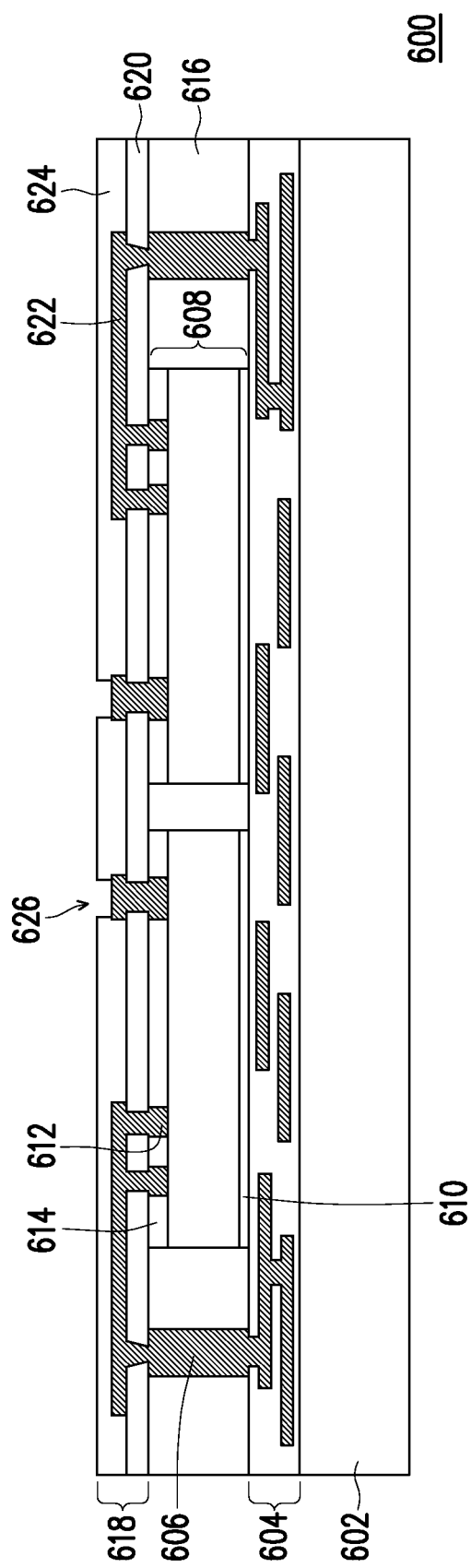

In FIG. 41, a front-side redistribution structure 618 is formed on the through vias 606, integrated circuit die 608, and encapsulant 616. The front-side redistribution structure 618 includes multiple dielectric layers 620 and metallization patterns 622. The topmost layer of the front-side redistribution structure 618 is a photosensitive adhesive film 624, and is formed on the topmost metallization patterns 622. The photosensitive adhesive film 624 is patterned to form openings 626 exposing the metallization patterns 622.

Figure 42A:
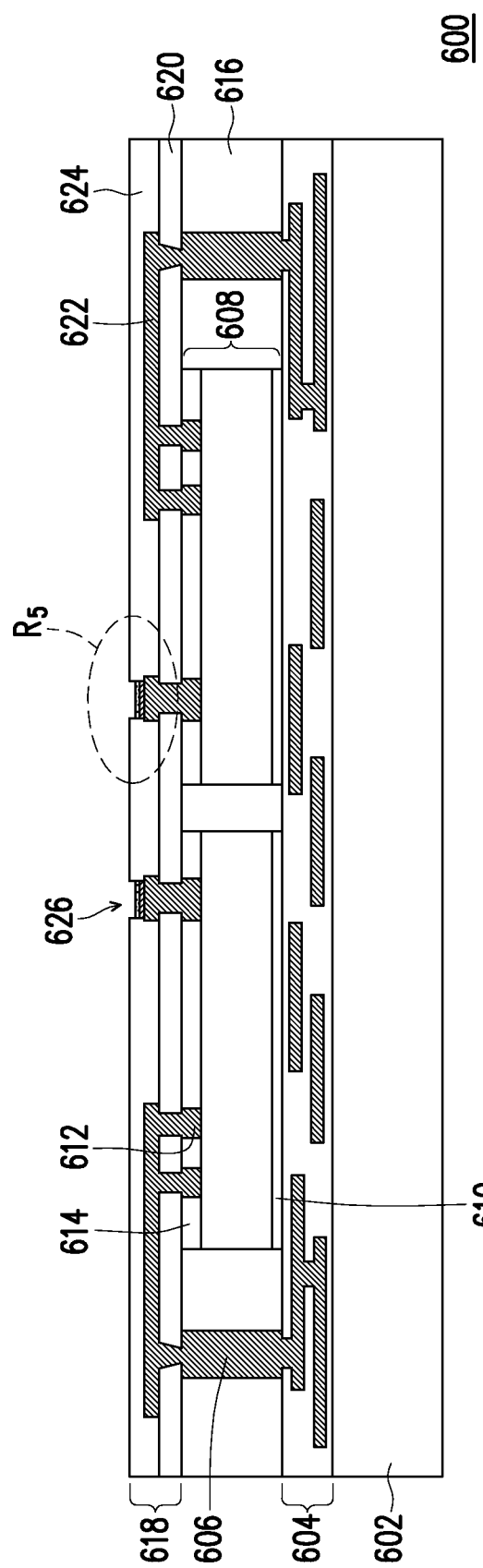
Figure 42B:
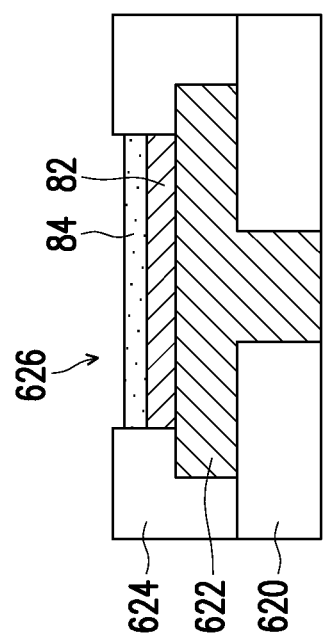

In FIGS. 42A and 42B, the conductive layers 82 are formed in the openings 626 on the metallization patterns 622. The reflowable layers 84 are then formed on the conductive layers 82 in the openings 626. The conductive layers 82 and reflowable layers 84 may be formed in a the site as they are in other embodiments.

In FIGS. 43A and 43B, an integrated circuit device 50 is attached to the front-side redistribution structure 618. Before being attached, the integrated circuit device 50 may be processed as described herein; for example, the integrated circuit device may be a processor, memory, or the like. For example, connectors 54 are formed on the active side of the integrated circuit device 50. The photosensitive adhesive film 56 is formed on the integrated circuit device 50 and patterned. The integrated circuit device 50 is pressed against the front-side redistribution structure 618 such that the photosensitive adhesive films 56 and 624 adhere to one another. Air gaps 104 are thus formed between the reflowable layers 62 and 84.

Figure 44A:
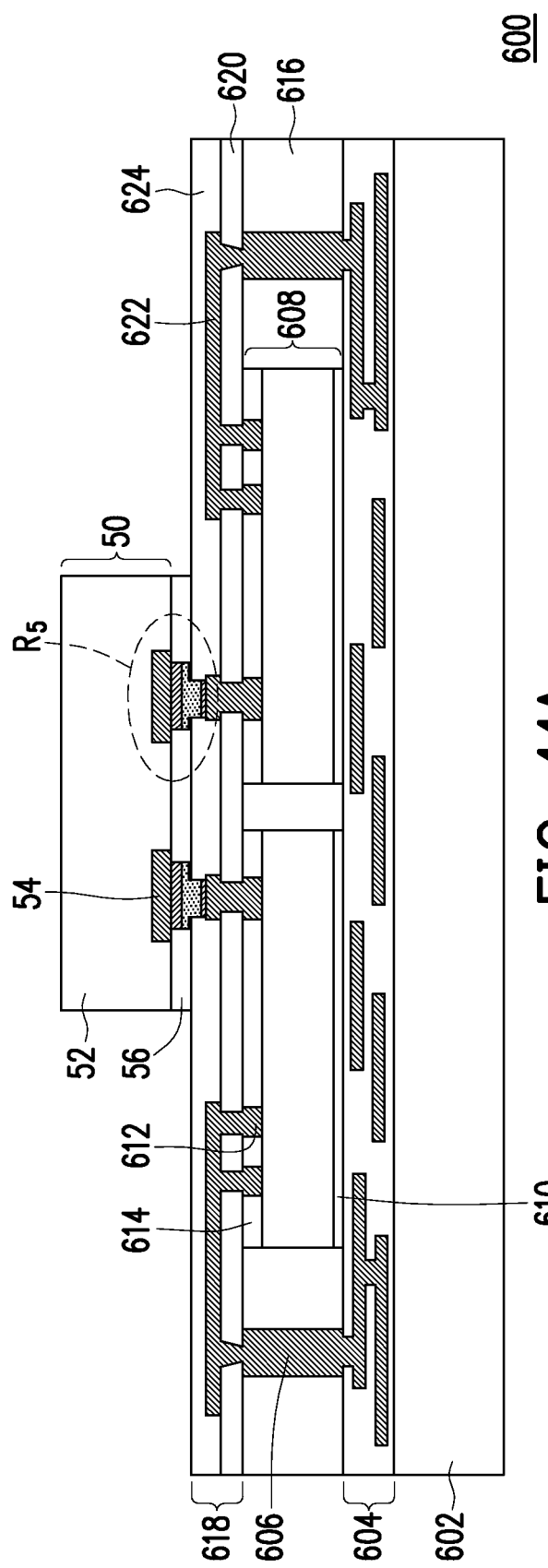
Figure 44B:
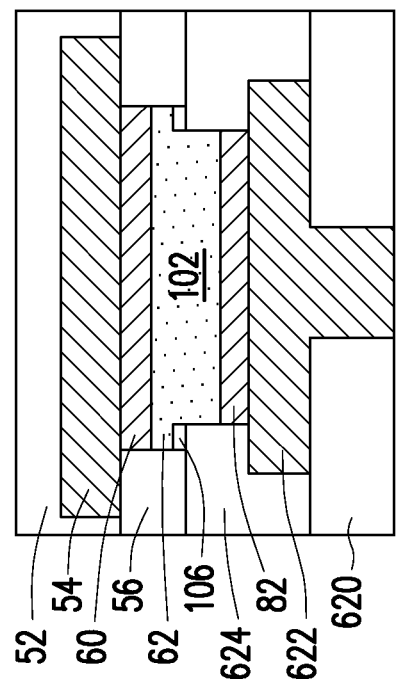

In FIGS. 44A and 44B, a reflow process is performed to reflow the reflowable layers 62 and 84, thereby forming the conductive connectors 102. Air gaps 106 are formed around the conductive connectors 102.

Figure 45:
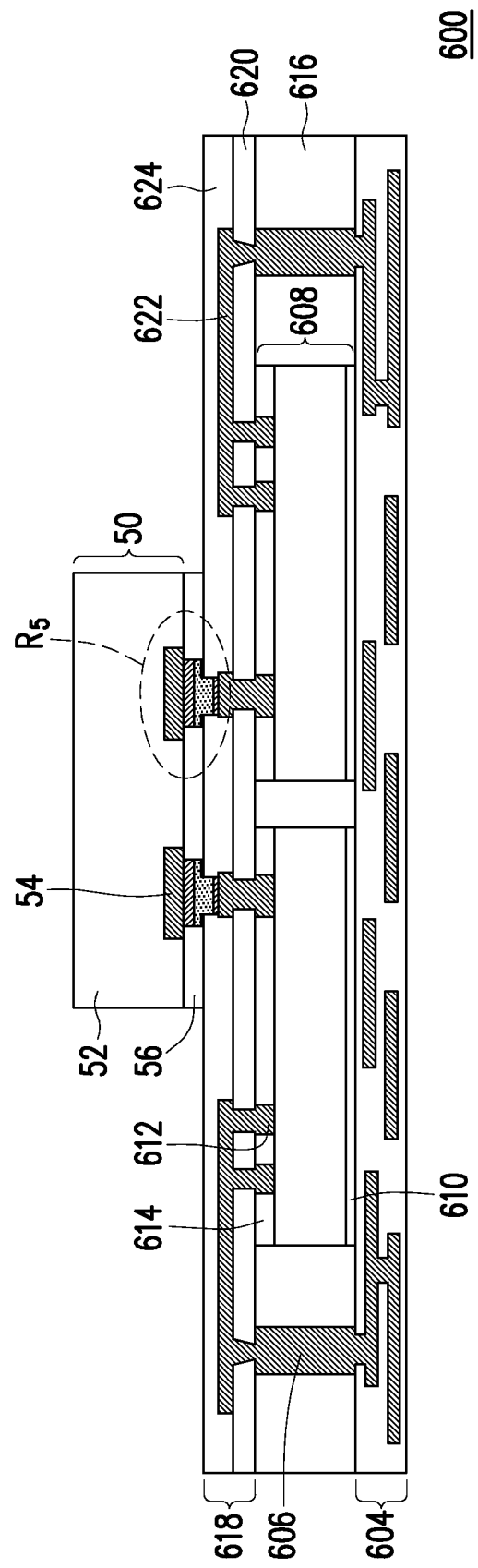

In FIG. 45, a carrier substrate de-bonding is performed to detach (de-bond) the carrier substrate 602 from the back-side redistribution structure 604.

Figure 46:
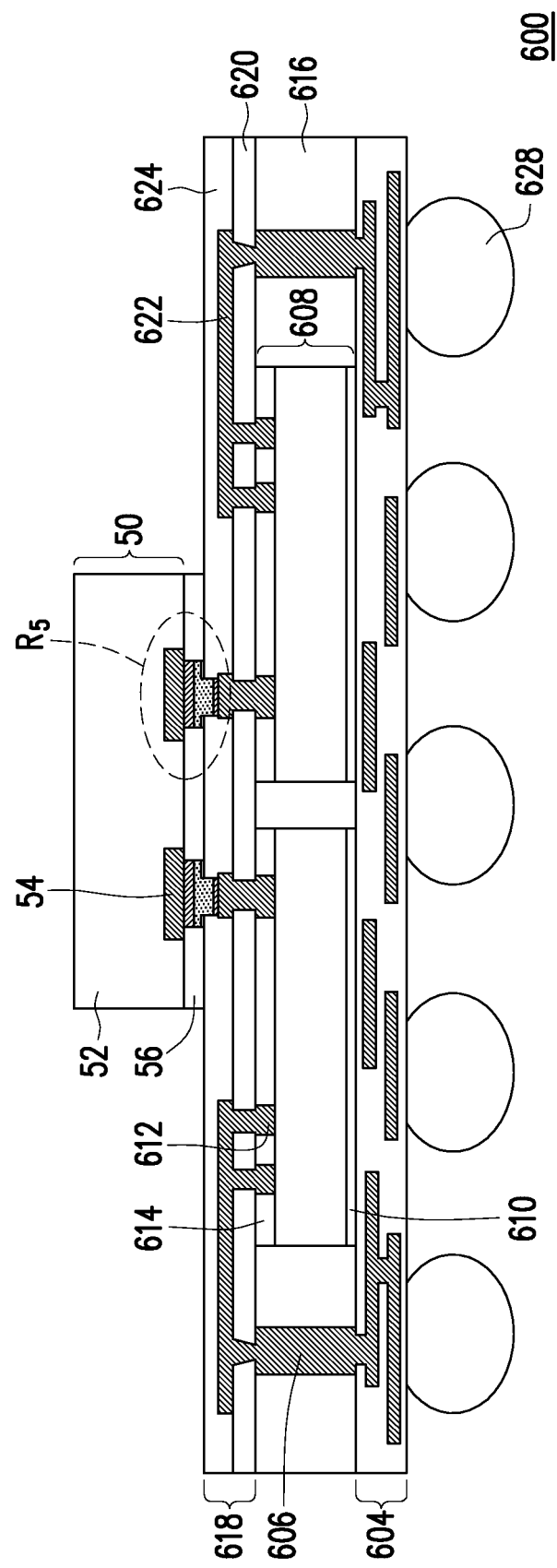

In FIG. 46, conductive connectors 628 are formed connected to the back-side redistribution structure 604. Openings may be formed in the back side of the back-side redistribution structure 604, exposing the metallization patterns of the back-side redistribution structure 604. The conductive connectors 628 are then formed in the openings.

FIGS. 47 through 57 are various views of intermediate steps during a process for forming a device package 700, in accordance with some embodiments. In an embodiment, the device package 700 is a Multi-Stack (MUST) package, although it should be appreciated that embodiments may be applied to other 3DIC packages. FIGS. 47 through 57 are cross-sectional views, where figures ending with an "A" designation show an overall view and figures ending with a "B" designation show a detailed view of a region $R_6$ from the corresponding "A" figure.

Figure 47:
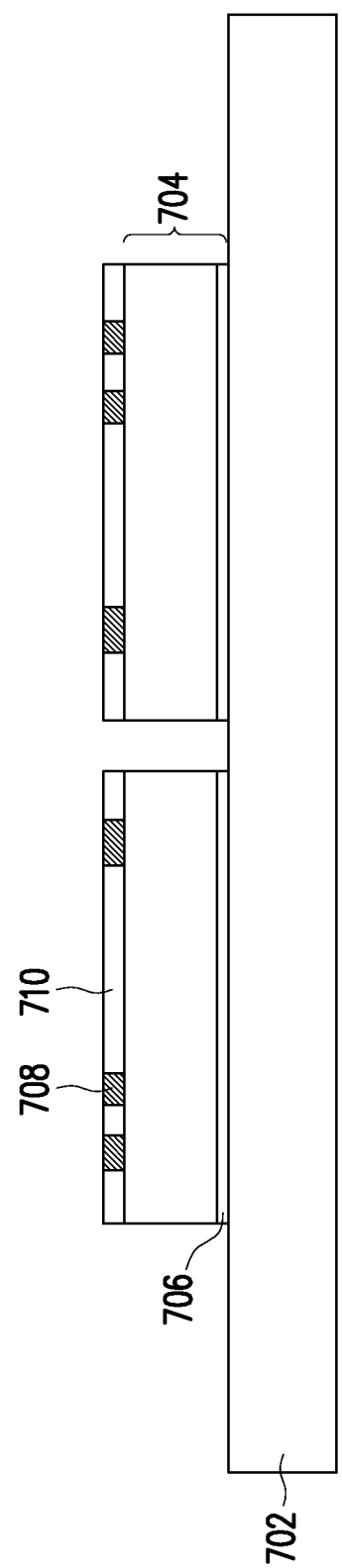
FIGS. 47 through 57 are various views of intermediate steps during a process for forming a device package, in accordance with some embodiments.

In FIG. 47, a carrier substrate 702 is provided, and integrated circuit dies 704 is adhered to the carrier substrate 702 by an adhesive 706. Die connectors 708, such as conductive pillars (for example, comprising a metal such as copper), are on the active side of the integrated circuit dies 704, and a dielectric material 710 is on the active side of the integrated circuit dies 704, around the die connectors 708.

Figure 48:
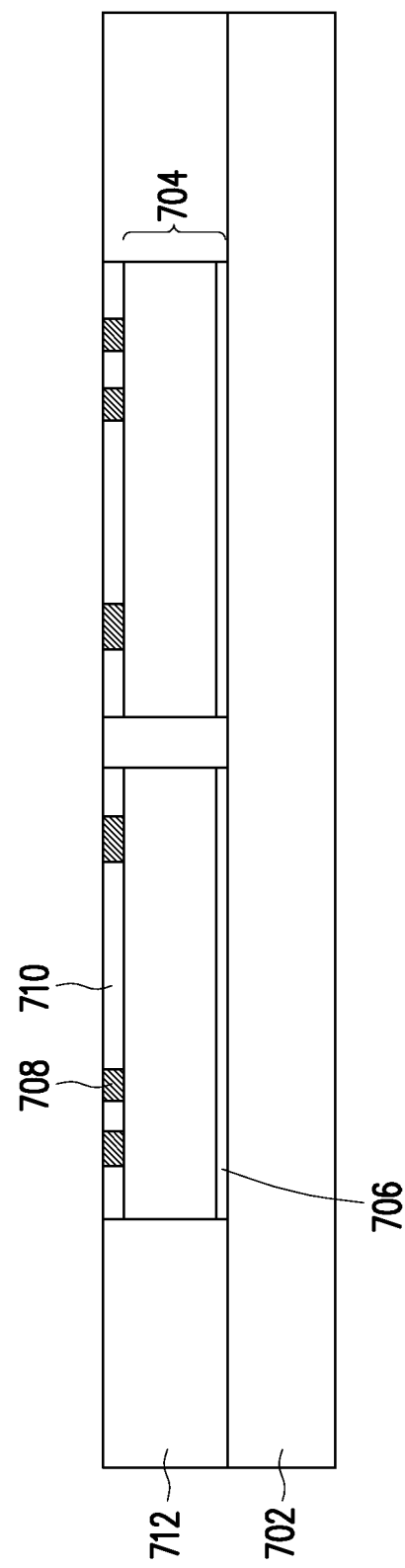

In FIG. 48, an encapsulant 712 is formed on and around the integrated circuit dies 704. The encapsulant 712 may be planarized such that top surfaces of the die connectors 708, dielectric material 710, and encapsulant 712 are level.

Figure 49:
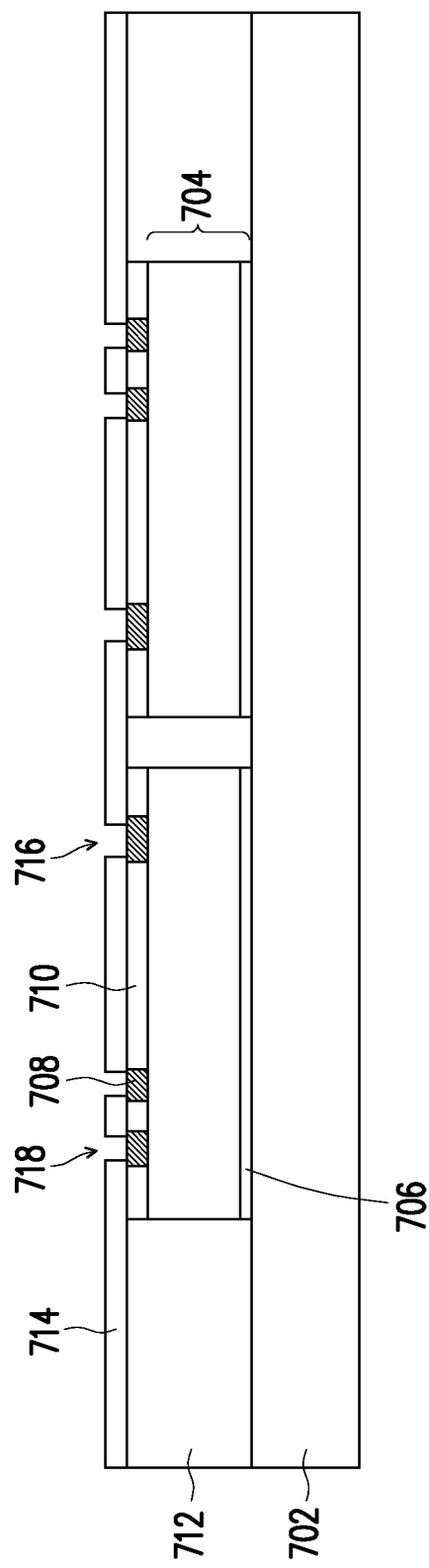

In FIG. 49, a photosensitive adhesive film 714 is formed on the integrated circuit dies 704 and encapsulant 712. The photosensitive adhesive film 714 is patterned to form openings 716 and 718 exposing the die connectors 708. The openings 716 and 718 are in different regions of the integrated circuit dies 704.

Figure 50A:
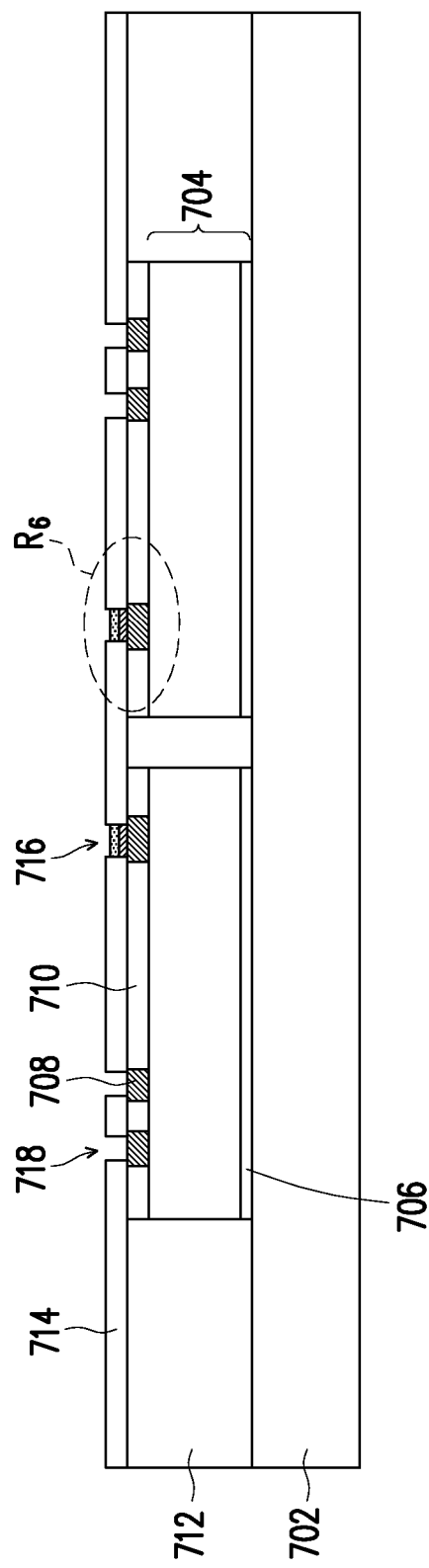
Figure 50B:
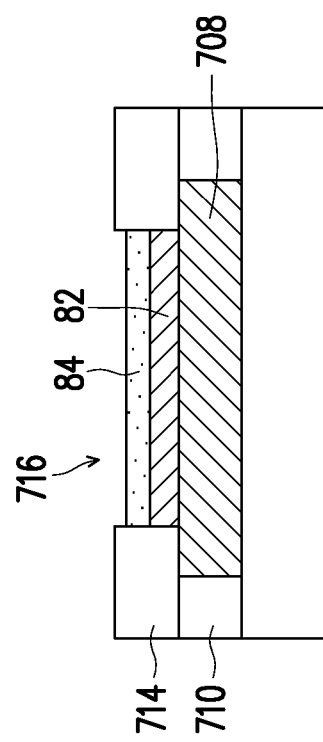

In FIGS. 50A and 50B, the conductive layers 82 are formed in the openings 716 on the die connectors 708. The reflowable layers 84 are then formed on the conductive layers 82 in the openings 716. The conductive layers 82 and reflowable layers 84 are not formed in the openings 718.

Figure 51:
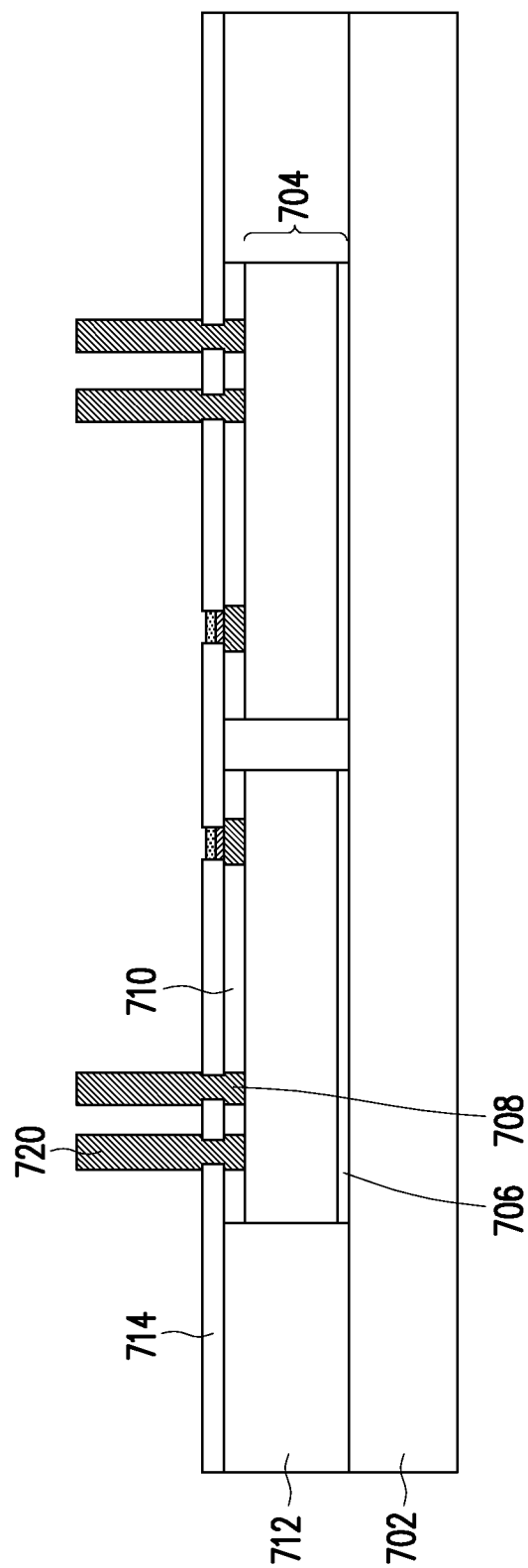

In FIG. 51, through vias 720 are formed on the photosensitive adhesive film 714. The through vias 720 may be similar to the through vias 404.

Figure 52A:
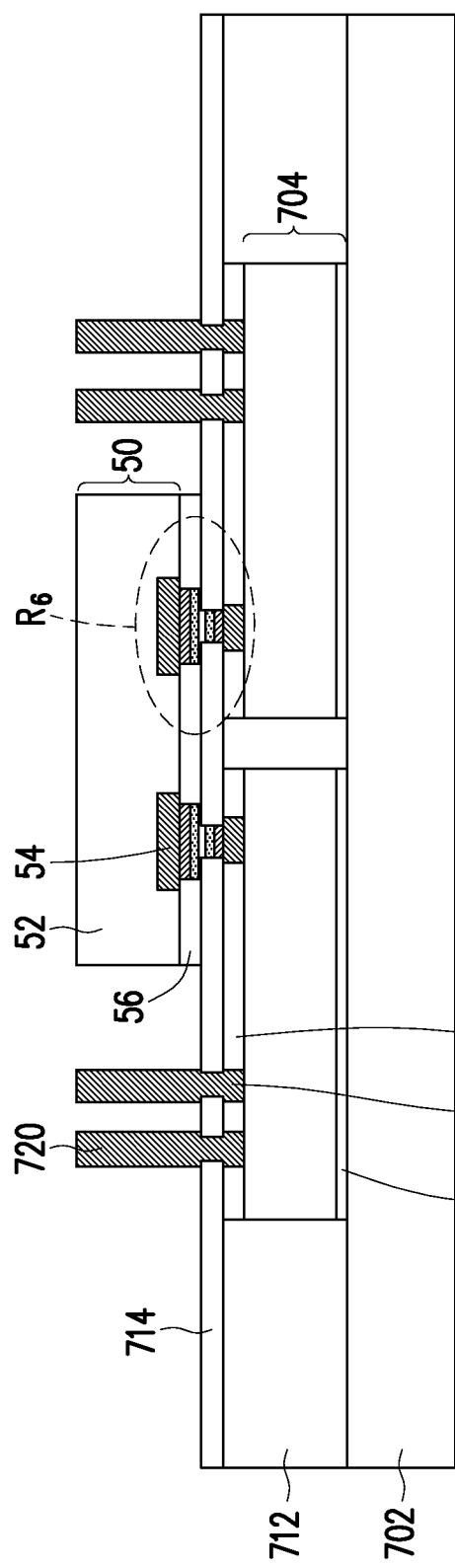
Figure 52B:
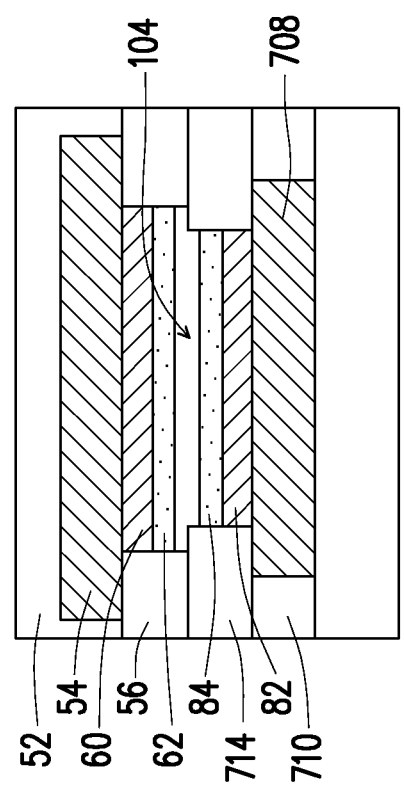

In FIGS. 52A and 52B, an integrated circuit device 50 is attached to the photosensitive adhesive film 714. Before being attached, the integrated circuit device 50 may be processed as described herein. For example, connectors 54 are formed on the active side of the integrated circuit device 50. The photosensitive adhesive film 56 is formed on the integrated circuit device 50 and patterned. The integrated circuit device 50 is pressed against the photosensitive adhesive film 714 such that the photosensitive adhesive films 56 and 714 adhere to one another. Air gaps 104 are thus formed between the reflowable layers 62 and 84.

Figure 53A:
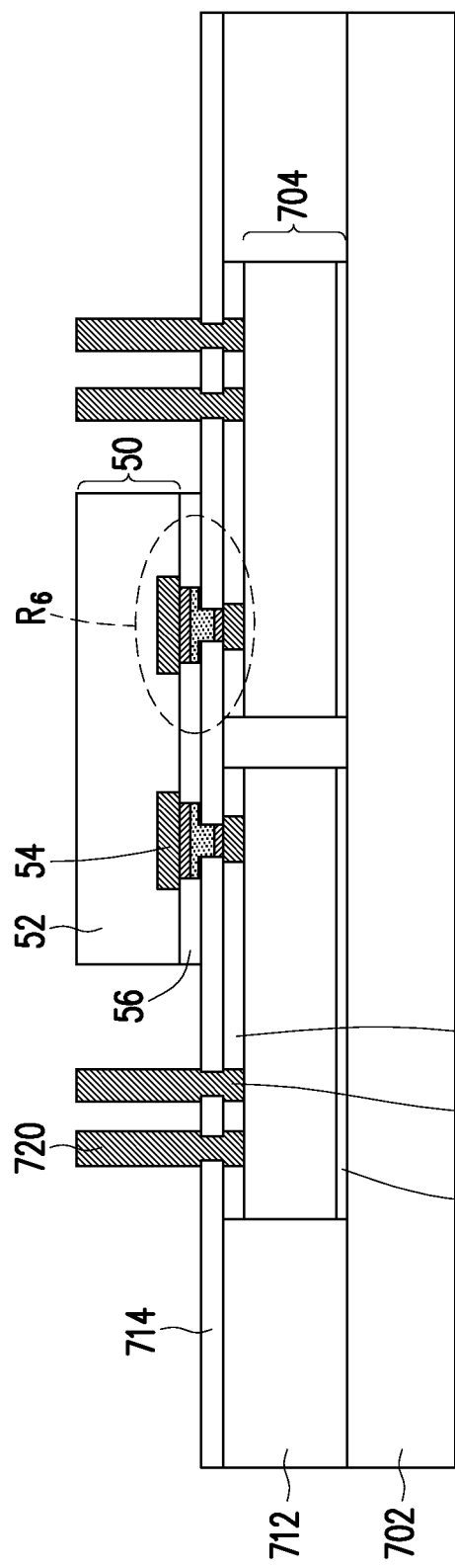
Figure 53B:
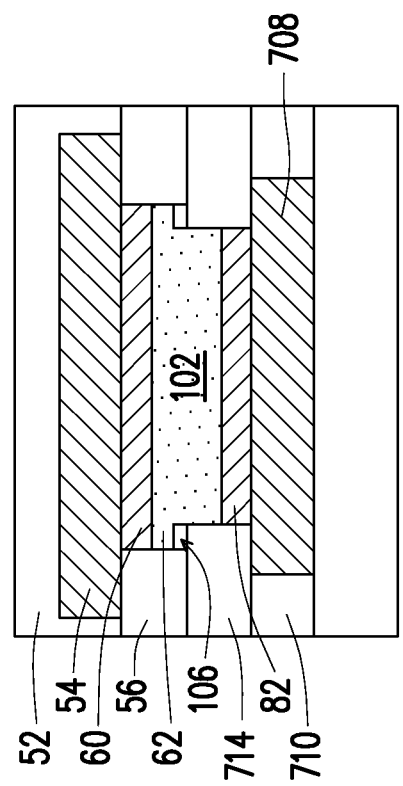

In FIGS. 53A and 53B, a reflow process is performed to reflow the reflowable layers 62 and 84, thereby forming the conductive connectors 102. Air gaps 106 are formed around the conductive connectors 102.

Figure 54:
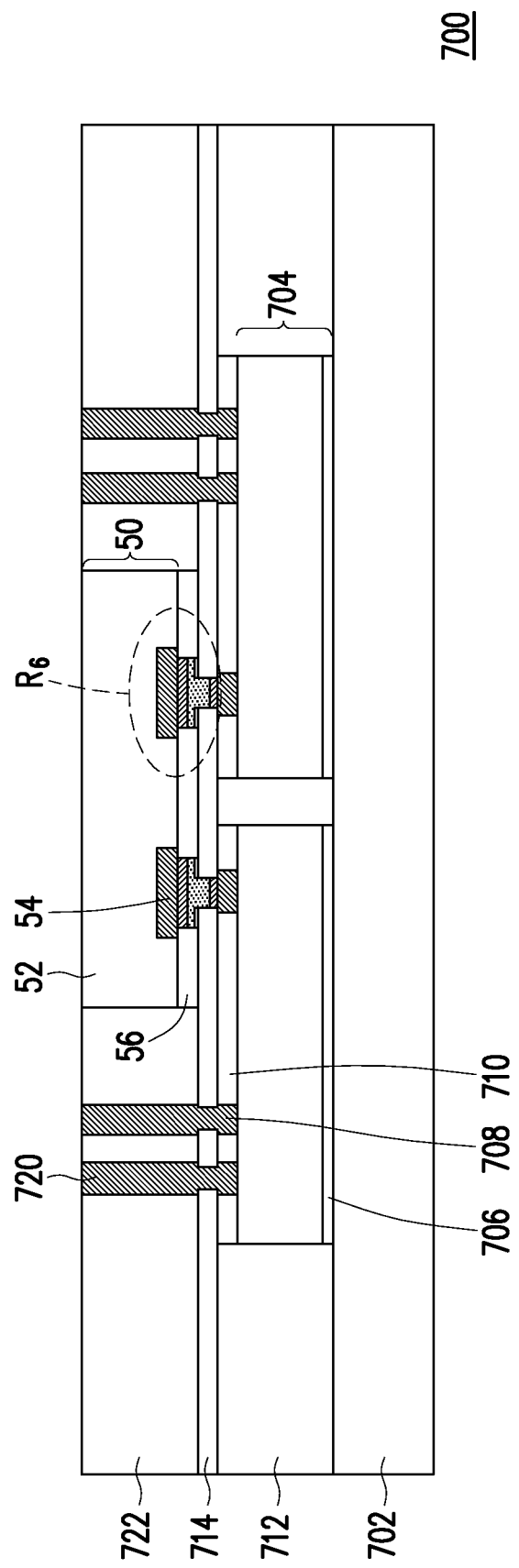

In FIG. 54, an encapsulant 722 is formed on the photosensitive adhesive film 714 and around the integrated circuit device 50 and through vias 720. The encapsulant 722 may be planarized such that top surfaces of the integrated circuit device 50, through vias 720, and encapsulant 722 are level.

Figure 55:
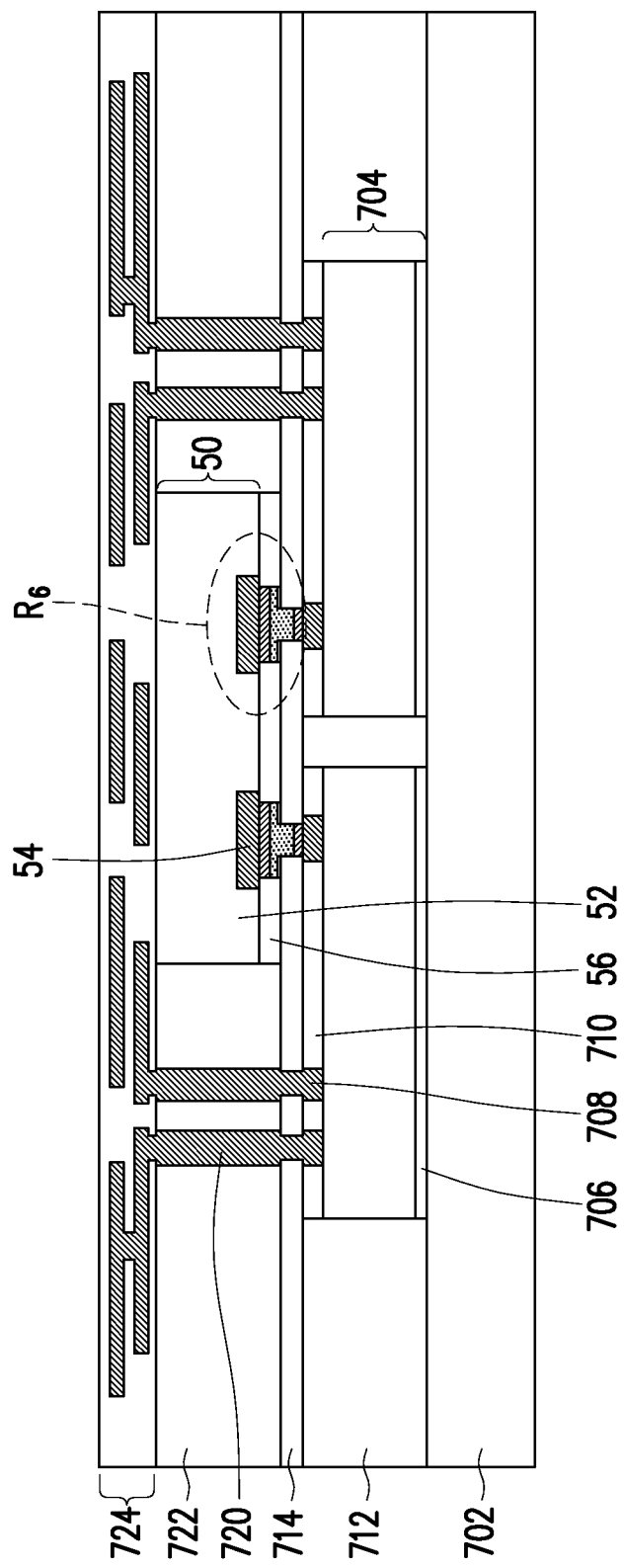

In FIG. 55, a front-side redistribution structure 724 is formed on the through vias 720, integrated circuit device 50, and encapsulant 722. The front-side redistribution structure 724 includes multiple dielectric layers and metallization patterns.

Figure 56:
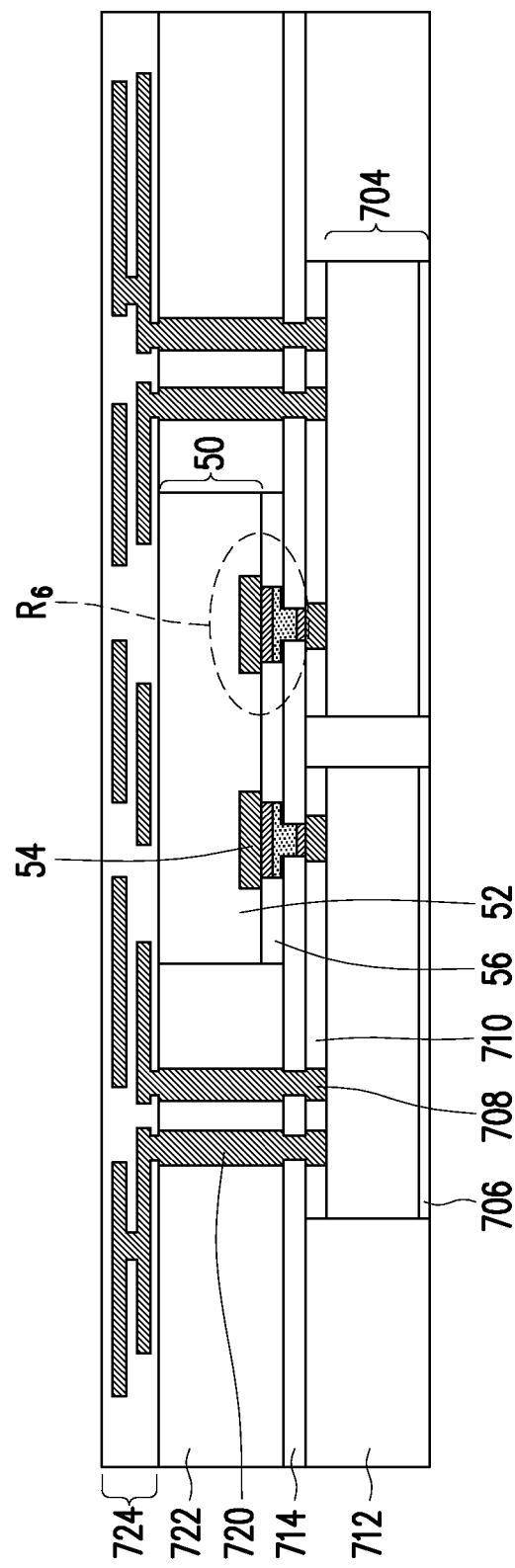

In FIG. 56, a carrier substrate de-bonding is performed to detach (de-bond) the carrier substrate 702 from the integrated circuit dies 704 and encapsulant 712.

Figure 57:
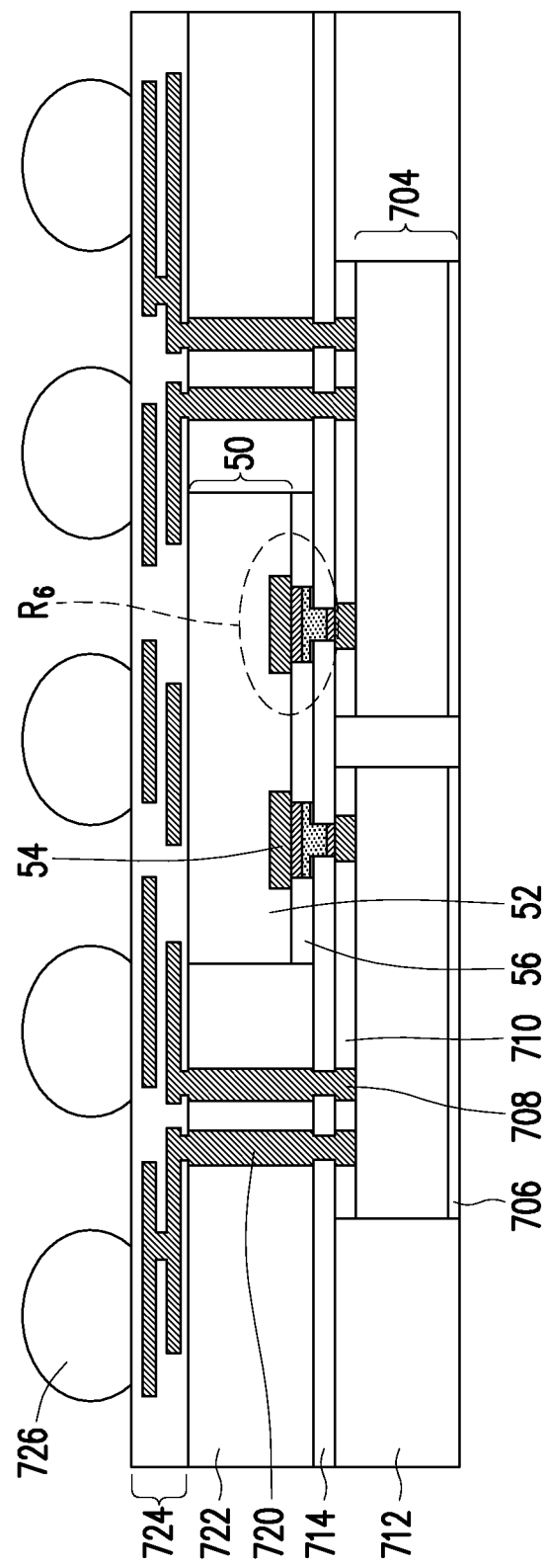
Figure 58A:
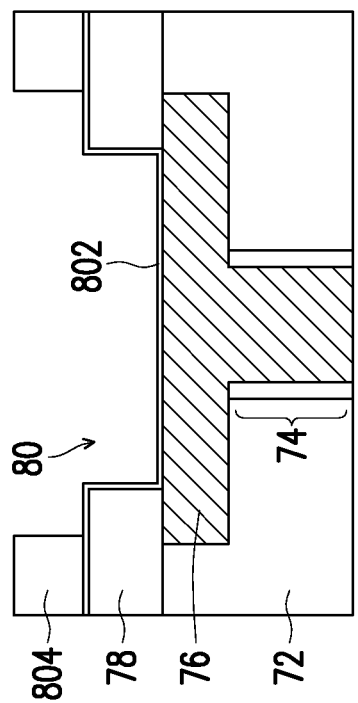
FIGS. 58A through 58F show a process for forming conductive connectors, in accordance with another embodiment.
Figure 58B:
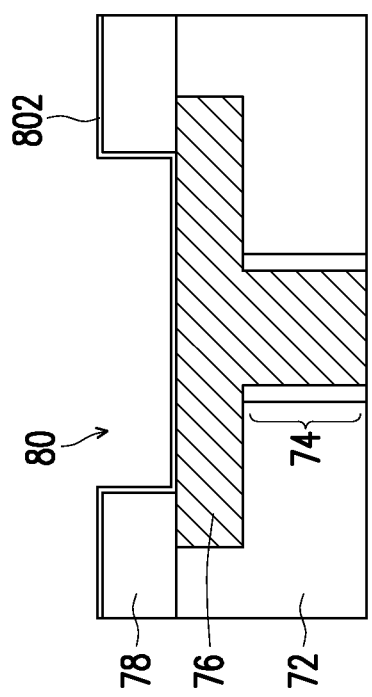
Figure 58D:
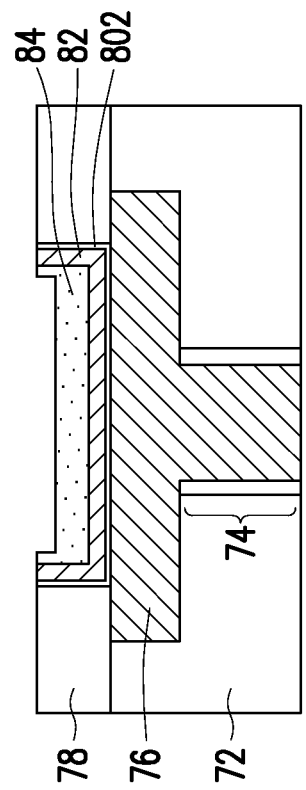
Figure 58C:
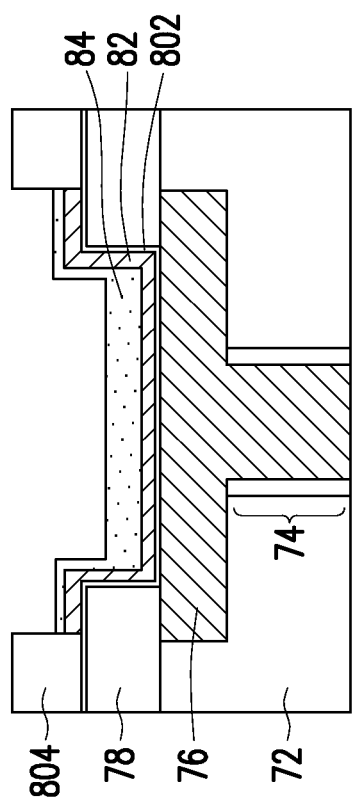
Figure 58F:
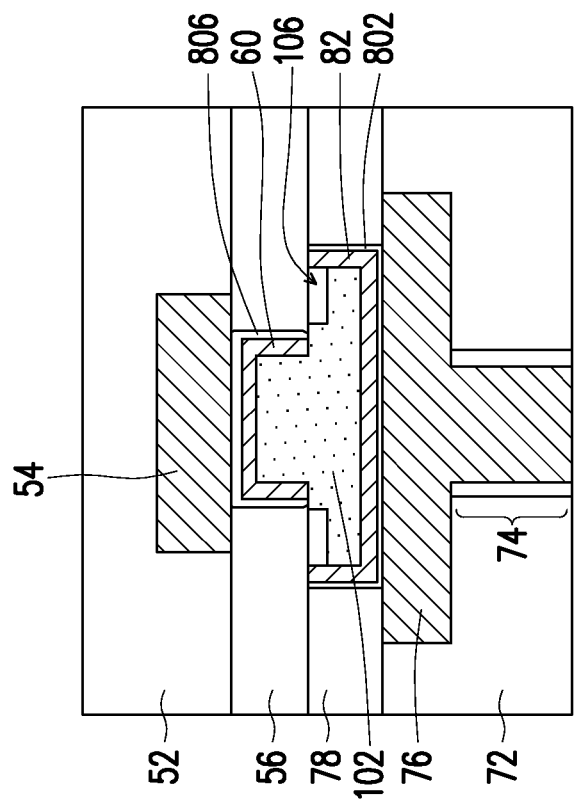
Figure 58E:
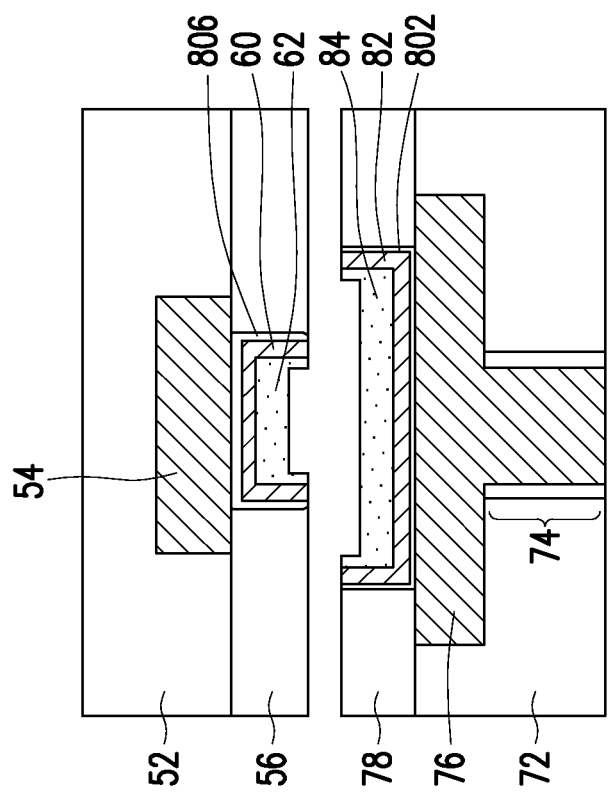
Figure 59A:
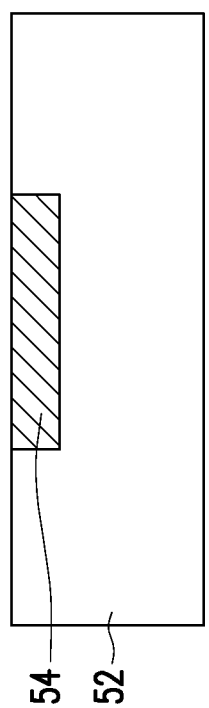
FIGS. 59A through 59K show a process for forming conductive connectors, in accordance with another embodiment.
Figure 59B:
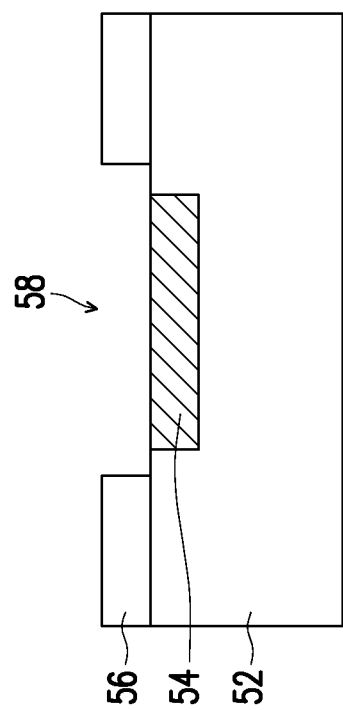
Figure 59C:
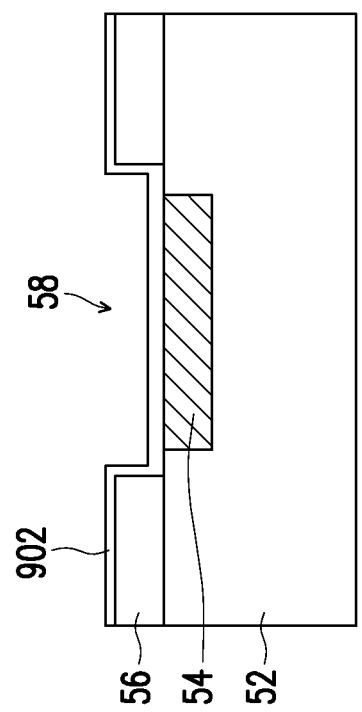
Figure 59D:
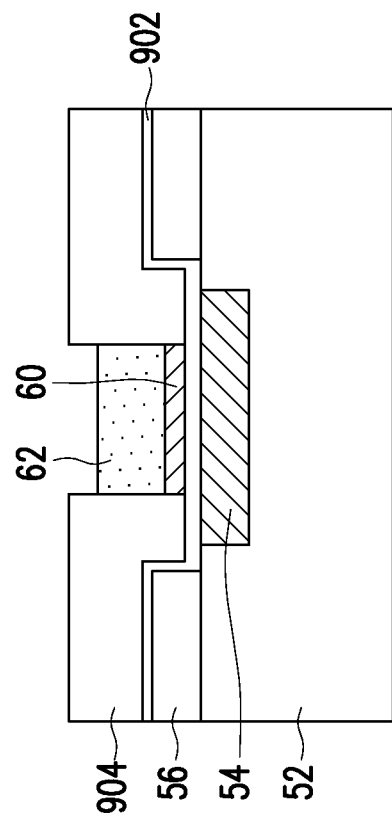
Figure 59F:
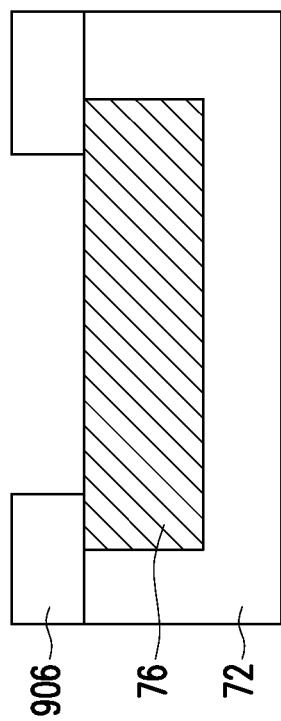
Figure 59E:
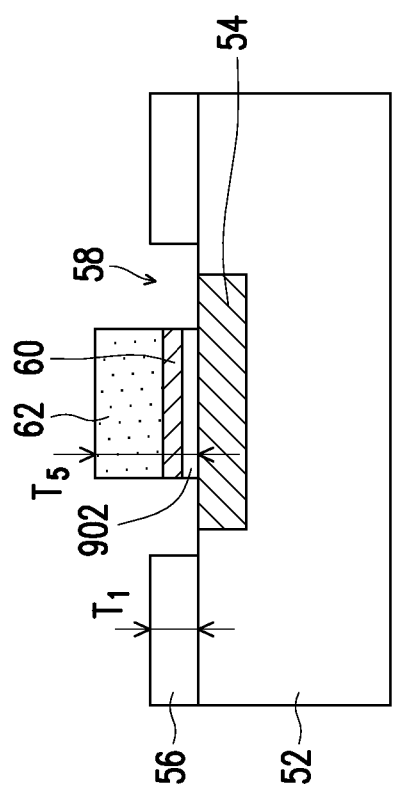
Figure 59G:
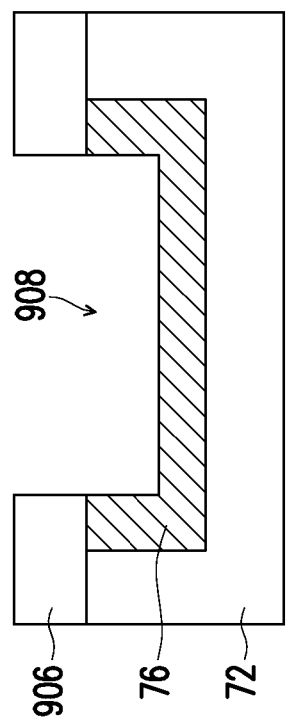
Figure 59H:
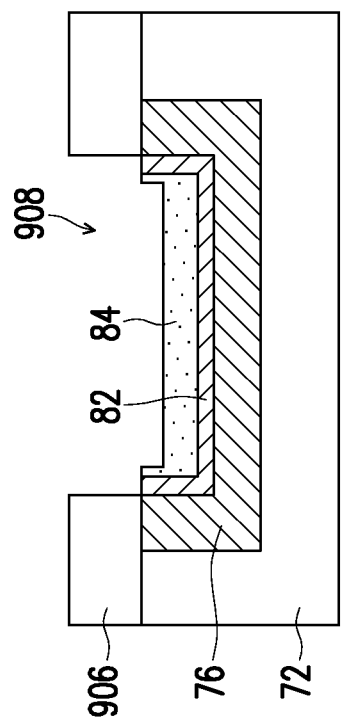
Figure 59I:
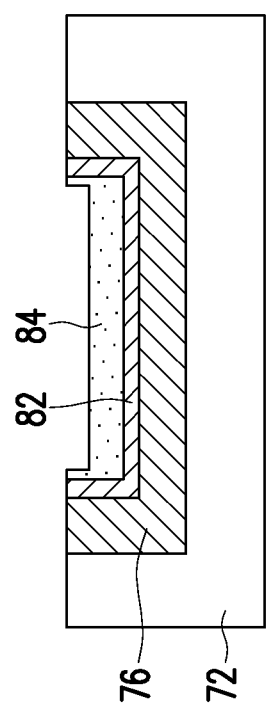
Figure 59J:
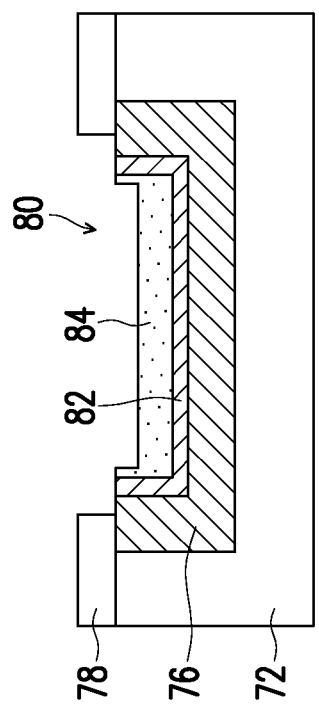
Figure 59K:
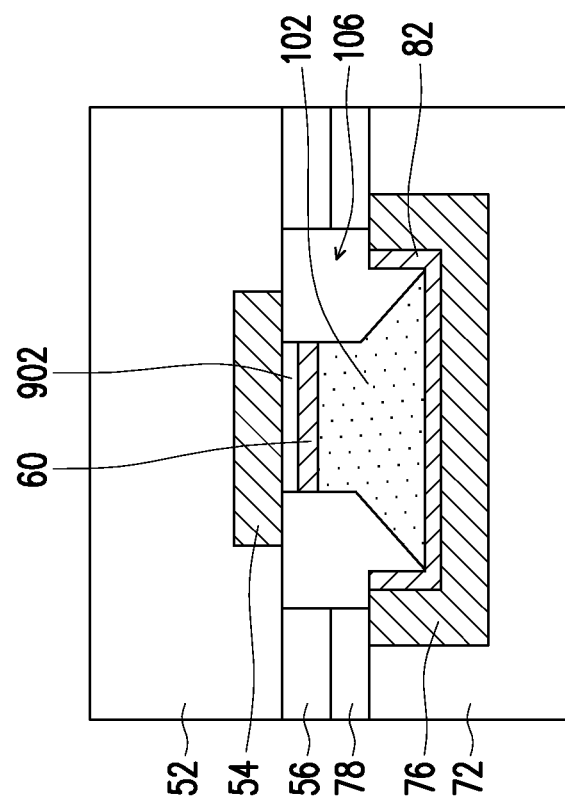
Figure 60B:
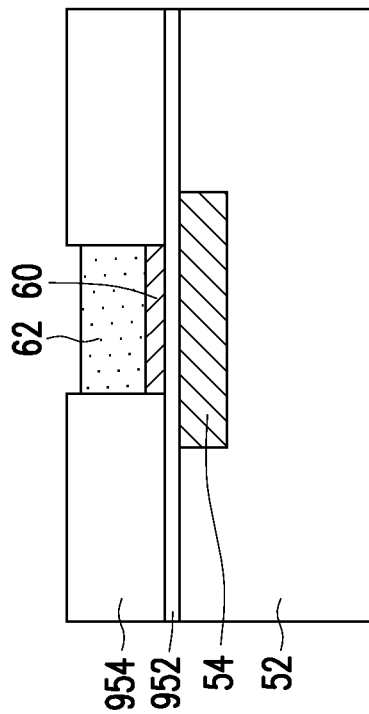
FIGS. 60A through 60F show a process for forming conductive connectors, in accordance with another embodiment.
Figure 60A:
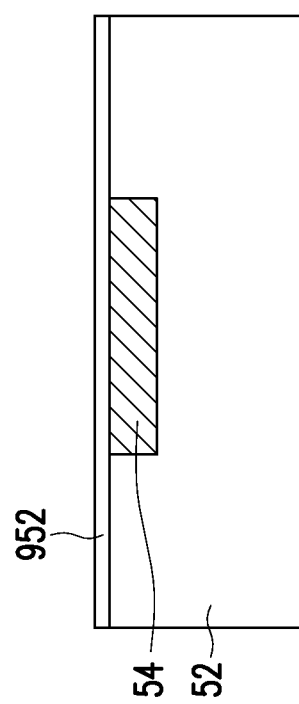
Figure 60D:
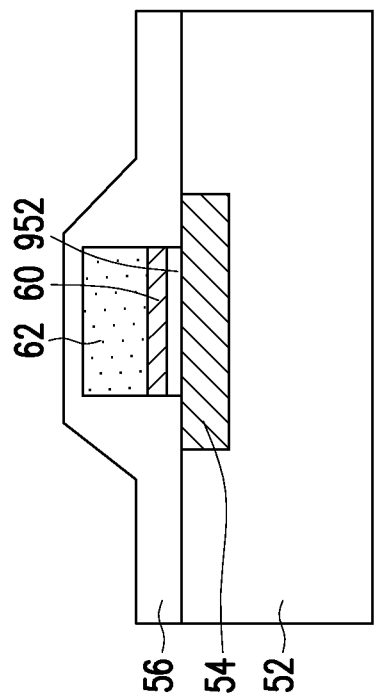
Figure 60C:
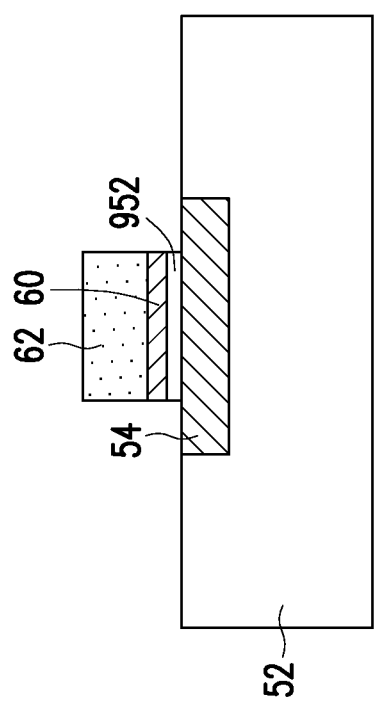
Figure 60F:
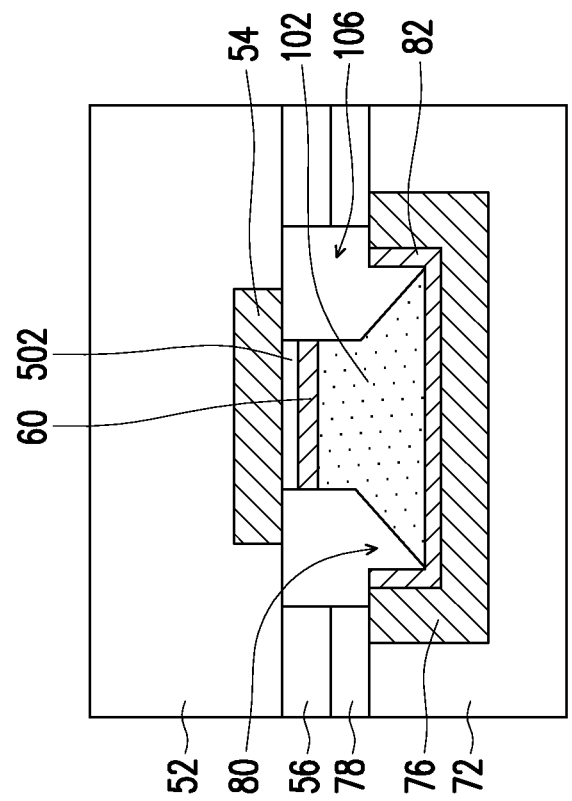
Figure 60E:
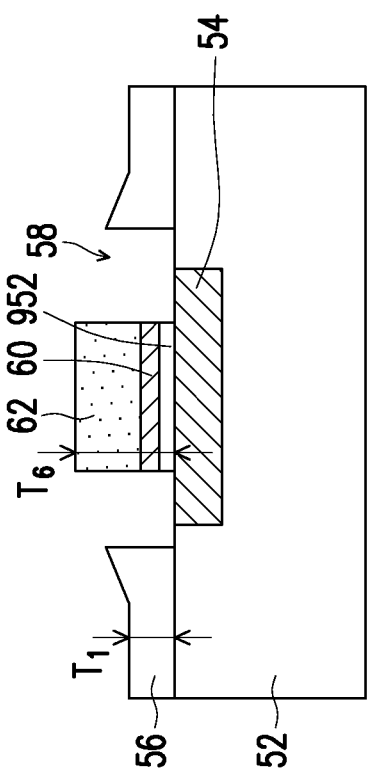

In FIG. 57, conductive connectors 726 are formed connected to the front-side redistribution structure 724. Openings may be formed in the front side of the front-side redistribution structure 724, exposing the metallization patterns of the front-side redistribution structure 724. The conductive connectors 726 are then formed in the openings.

It should be appreciated that the conductive connectors 102 may be formed in other manners. FIGS. 58A through 58F show a process for forming the conductive connectors 102, in accordance with some other embodiments. FIGS. 59A through 59K show a process for forming the conductive connectors 102, in accordance with yet other embodiments. FIGS. 60A through 60F show a process for forming the conductive connectors 102, in accordance with yet other embodiments. The conductive connectors 102 formed according to the subsequent descriptions may be used in any of the above embodiments.

In the embodiment of FIGS. 58A through 58F, seed layers 802 are formed in the openings 80 of the photosensitive adhesive film 78. A photoresist 804 is formed on the photosensitive adhesive film 78 and is patterned with openings exposing the connectors 76. The conductive layers 82 and reflowable layers 84 are formed in the openings in the photoresist 804 and on the connectors 76. As such, the conductive layers 82 extend along sides of the openings 80. The photoresist 804 is removed, and excess material of the conductive layers 82 and reflowable layers 84 outside of the openings 80 is removed by, e.g., a CMP process. The process may be repeated in the openings 58 of the photosensitive adhesive film 56. Subsequently, the photosensitive adhesive film 56 and 78 are bonded and the reflowable layers 62 and 84 reflowed, as described above for FIGS. 5A through 6B.

In the embodiment of FIG. 59A through 59K, seed layers 902 are formed in the openings 58 of the photosensitive adhesive film 56. A photoresist 904 is then formed on the seed layers 902. The photoresist 904 extends along the photosensitive adhesive film 56, and some portions are formed in the openings 58. The photoresist 904 is patterned with openings exposing the portions of the seed layers 902 on the connectors 54. The seed layers 902 are used in a plating process for forming the conductive layers 60, and in a plating process for forming the reflowable layers 62. The combined thickness $T_5$ of the seed layers 902, conductive layers 60, and reflowable layers 62 may be greater than the thickness $T_1$ of the photosensitive adhesive film 56. After formation of the conductive layers 60 and reflowable layers 62, the photoresist 904 and exposed portions of the seed layers 902 are removed. Notably, the width of the reflowable layers 62 is less than the width of the openings 58, and so portions of the connectors 54 are exposed when the photoresist 904 in the openings 58 is removed.

A photoresist 906 is formed on the substrate 72, and patterned with openings exposing the connectors 76. A metal etching process, such as a dry or wet etch, is performed to form openings 908 in the connectors 76. The conductive layers 82 and reflowable layers 84 are then formed in the openings 908. The combined thickness of the conductive layers 82 and reflowable layers 84 may be greater or less than or less than the depth of the openings 908, but do not extend above top surfaces of the subsequently-formed photosensitive adhesive film 78. In the embodiment shown, the conductive layers 82 and reflowable layers 84 are plated in the openings 908 with an electroless plating process, although it should be appreciated that a seed layer may be formed in other plating processes. The photoresist 906 is then removed, and the photosensitive adhesive film 78 is formed and patterned with openings exposing the conductive layers 82.

The integrated circuit device 50 is then attached to the wafer 70. Due to the thickness $T_5$ (see FIG. 59E) of the seed layers 902, conductive layers 60, and reflowable layers 62, the reflowable layers 62 extend into the openings 80 in the photosensitive adhesive film 78. In an embodiment, the integrated circuit device 50 is attached after the photosensitive adhesive film 56 is cured, but before the photosensitive adhesive film 78 is cured. A reflow process is performed, as described above for FIGS. 5A through 6B, thereby forming the conductive connector 102 surrounded by the air gaps 106. The reflow process may also cure the photosensitive adhesive film 78, thereby bonding the photosensitive adhesive film 56 and 78 together.

In the embodiment of FIGS. 60A through 60F, a seed layer 952 are formed on the front side of the integrated circuit device 50. A photoresist 954 is then formed on the seed layer 952. The photoresist 954 is patterned with openings exposing the portions of the seed layer 952 on the connectors 54. The seed layer 952 is used in a plating process for forming the conductive layers 60, and in a plating process for forming the reflowable layers 62. After formation of the conductive layers 60 and reflowable layers 62, the photoresist 954 and exposed portions of the seed layer 952 are removed. The photosensitive adhesive film 56 is then formed on the substrate 52, and in particular, is formed over the reflowable layers 62. The openings 58 are then formed in the photosensitive adhesive film 56, exposing the conductive layers 60 and reflowable layers 62. Notably, the width of the reflowable layers 62 is less than the width of the openings 58, and so portions of the connectors 54 are exposed when the openings 58 are formed. The combined thickness $T_6$ of the seed layer 952, conductive layers 60, and reflowable layers 62 may be greater than the thickness $T_1$ of the photosensitive adhesive film 56.

The integrated circuit device 50 is then attached to the wafer 70. Similar to the above embodiments, openings may be formed in the connectors 76 of the wafer 70. Due to the thickness $T_6$ of the seed layer 952, conductive layers 60, and reflowable layers 62, the reflowable layers 62 extend into the openings 80 in the photosensitive adhesive film 78. In the embodiment shown, the conductive layers 82 and reflowable layers 84 are plated in openings formed in the connectors 76. In an embodiment, the integrated circuit device 50 is attached after the photosensitive adhesive film 56 is cured, but before the photosensitive adhesive film 78 is cured. The photosensitive adhesive film 78 is then cured, thereby bonding the photosensitive adhesive film 56 and 78 together. A reflow process is performed, as described above for FIGS. 5A through 6B, thereby forming the conductive connector 102 surrounded by the air gaps 106.

Figure 61A:
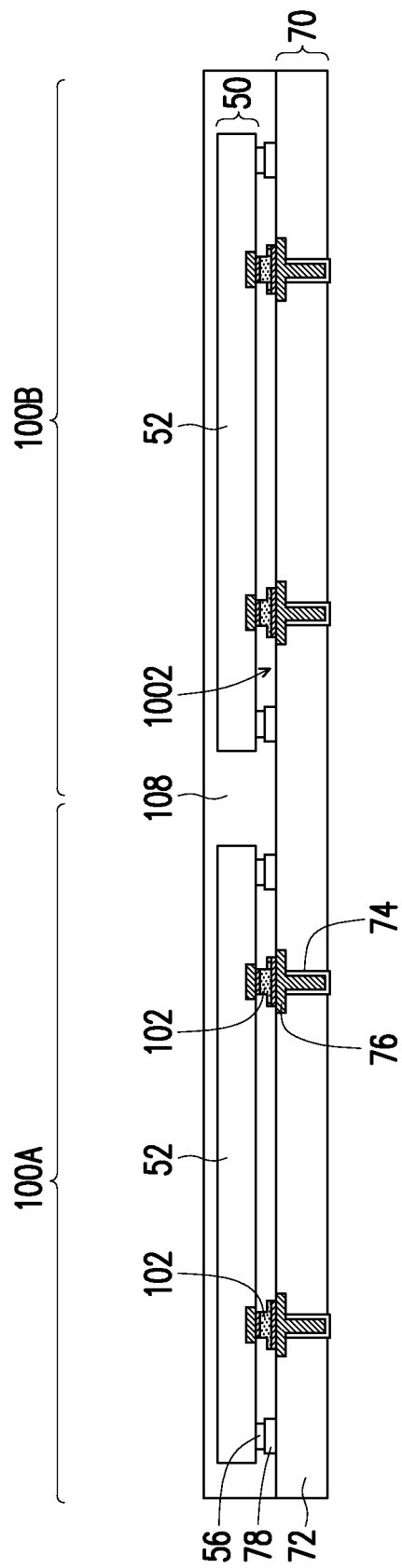
FIGS. 61A and 61B are various views of a device package, in accordance with some other embodiments.
Figure 61B:
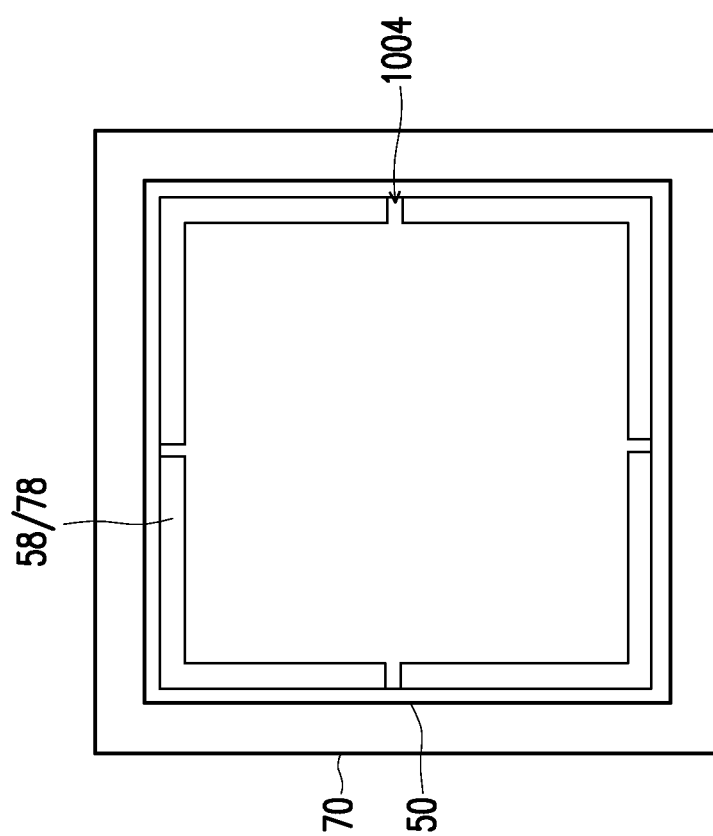

FIGS. 61A through 61B show a process for forming the conductive connectors 102, in accordance with some other embodiments. FIG. 61B is a top-down view of the structure of FIG. 61A. In the embodiment shown, the photosensitive adhesive films 56 and 78 are patterned such that they are only formed around the perimeter of the integrated circuit devices 50. As such, after the bonding and reflow, a cavity 1002 is formed, with each of the conductive connectors 102 exposed to the cavity 1002. The cavity 1002 may be formed with openings 1004 around the perimeter, which provide air movement paths. The openings 1004 may have a width of from about 5 µm to about 50 µm. In some embodiments, the openings 1004 may be formed with a bend in the top-down view, to prevent the encapsulant 108 from flowing into the cavity 1002.

Embodiments may achieve advantages. Forming the air gaps 106 creates a buffering space between adjacent conductive connectors 102, allowing the conductive connector 102 to be formed with a finer pitch. Use of the photosensitive adhesive films 56 and 78 may simplify face-to-face bonding, reducing manufacturing costs.

In an embodiment, a device includes: a first device including: an integrated circuit device having a first connector; a first photosensitive adhesive layer on the integrated circuit device; and a first conductive layer on the first connector, the first photosensitive adhesive layer surrounding the first conductive layer; a second device including: an interposer having a second connector; a second photosensitive adhesive layer on the interposer, the second photosensitive adhesive layer physically connected to the first photosensitive adhesive layer; and a second conductive layer on the second connector, the second photosensitive adhesive layer surrounding the second conductive layer; and a conductive connector bonding the first and second conductive layers, the conductive connector surrounded by an air gap. In some embodiments of the device, a first width of the first conductive layer is less than a second width of the second conductive layer. In some embodiments of the device, the conductive connector has a first portion adjacent the first integrated circuit device and a second portion adjacent the second integrated circuit device, the first portion having the first width, the second portion having the second width. In some embodiments of the device, the air gap separates the second portion of the conductive connector from the first photosensitive adhesive layer. In some embodiments of the device, no seed layers are formed between the first connector and the first conductive layer or between the first conductive layer and the conductive connector. In some embodiments, the device further includes: a first seed layer formed between the first connector and the first conductive layer, where no seed layers are formed between the first conductive layer and the conductive connector.

In an embodiment, a method includes: forming a first opening in a first photosensitive adhesive layer, the first photosensitive adhesive layer being adjacent a first side of a first integrated circuit device; plating a first reflowable layer in the first opening; forming a second opening in a second photosensitive adhesive layer, the second photosensitive adhesive layer being adjacent a first side of a second integrated circuit device; plating a second reflowable layer in the second opening; pressing the first and second photosensitive adhesive layers together, thereby physically connecting the first and second integrated circuit devices; and reflowing the first and second reflowable layers, thereby forming a conductive connector electrically connecting the first and second integrated circuit devices.

In some embodiments, the method further includes: encapsulating the first integrated circuit device with a molding compound, the molding compound being adjacent the first side of the second integrated circuit device; singulating the first integrated circuit device; forming a redistribution structure adjacent a second side of the second integrated circuit device; and forming conductive balls on the redistribution structure. In some embodiments, the method further includes: bonding the second integrated circuit device to a package substrate using the conductive balls. In some embodiments, the method further includes: forming a third opening in a third photosensitive adhesive layer, the third photosensitive adhesive layer being adjacent a second side of the first integrated circuit device; plating a third reflowable layer in the third opening; and physically connecting a third integrated circuit device to the first integrated circuit device using the third photosensitive adhesive layer and the third reflowable layer. In some embodiments, the method further includes: forming first vias on the first side of the second integrated circuit device; forming a redistribution structure adjacent a second side of the second integrated circuit device, the redistribution structure electrically connected to the first vias; forming conductive connectors on the redistribution structure; and singulating the first integrated circuit device and the redistribution structure. In some embodiments, the method further includes: forming second vias adjacent the first and second integrated circuit devices; and encapsulating the first vias and the second vias with a molding compound. In some embodiments of the method, after reflowing the first reflowable layer, the conductive connector is surrounded by an air gap.

In an embodiment, a method includes: encapsulating a plurality of first integrated circuit devices with a first molding compound; forming a first photosensitive adhesive layer over the first integrated circuit devices; patterning a first opening the first photosensitive adhesive layer; plating a first conductive layer in the first opening; plating a first reflowable layer on the first conductive layer, a combined thickness of the first conductive layer and the first reflowable layer being less than a first thickness of the first photosensitive adhesive layer, the first conductive layer and the first reflowable layer electrically connected to the first integrated circuit devices; pressing a second integrated circuit device to the first photosensitive adhesive layer to physically connect the first and second integrated circuit devices; and reflowing the first reflowable layer to form a conductive connector electrically connecting the first and second integrated circuit devices.

In some embodiments, the method further includes: forming a first redistribution structure over the first integrated circuit devices, the first photosensitive adhesive layer being a topmost layer of the first redistribution structure, the second integrated circuit device bonded to the first redistribution structure after reflowing the first reflowable layer. In some embodiments, the method further includes: placing the first integrated circuit devices on a second redistribution structure. In some embodiments, the method further includes: forming vias extending through the first molding compound, the vias electrically connecting the first and second redistribution structures. In some embodiments, the method further includes: encapsulating the second integrated circuit device with a second molding compound; and forming a first redistribution structure over the second integrated circuit device and the second molding compound. In some embodiments, the method further includes: forming vias extending through the second molding compound, the vias electrically connecting the first redistribution structure and the first integrated circuit devices. In some embodiments of the method, after reflowing the first reflowable layer, the conductive connector is surrounded by an air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first device comprising:
      an integrated circuit device comprising a first connector;
      a first polymer adhesive layer on the integrated circuit device; and
      a first conductive layer on the first connector, the first polymer adhesive layer surrounding the first conductive layer;
   a second device comprising:
      an interposer comprising a second connector;
      a second polymer adhesive layer on the interposer, the second polymer adhesive layer physically connected to the first polymer adhesive layer; and
      a second conductive layer on the second connector, the second polymer adhesive layer surrounding the second conductive layer; and
   a conductive connector bonding the first conductive layer to the second conductive layer, the conductive connector surrounded by an air gap.

2. The device of claim 1, wherein a first width of the first conductive layer is less than a second width of the second conductive layer.

3. The device of claim 2, wherein the conductive connector has a first portion adjacent the integrated circuit device and a second portion adjacent the interposer, the first portion having the first width, the second portion having the second width.

4. The device of claim 3, wherein the air gap separates the second portion of the conductive connector from the first polymer adhesive layer.

5. The device of claim 3, wherein the air gap separates the first portion of the conductive connector from the second polymer adhesive layer.

6. The device of claim 1, wherein no seed layers are disposed between the first connector and the first conductive layer or between the first conductive layer and the conductive connector.

7. The device of claim 1, further comprising:
   a seed layer disposed between the first connector and the first conductive layer, no seed layers being disposed between the first conductive layer and the conductive connector.

8. A device comprising:
   an integrated circuit device comprising a first connector at a first side of the integrated circuit device;
   an interposer comprising a second connector at a first side of the interposer;
   a polymer adhesive material adhering the integrated circuit device to the interposer, the polymer adhesive material being a continuous layer extending from the first side of the integrated circuit device to the first side of the interposer;
   a conductive connector extending through the polymer adhesive material, the conductive connector electrically connecting the first connector to the second connector, a portion of the conductive connector being exposed to an air gap in the polymer adhesive material;
   a molding compound encapsulating the integrated circuit device, the molding compound being disposed at the first side of the interposer; and a package substrate connected to a second side of the interposer, the second side of the interposer being opposite the first side of the interposer.

9. The device of claim 8, wherein the polymer adhesive material comprises:
a first polymer adhesive layer at the first side of the integrated circuit device, the first polymer adhesive layer surrounding the first connector; and
a second polymer adhesive layer at the first side of the interposer, the second polymer adhesive layer surrounding the second connector, the first polymer adhesive layer and the second polymer adhesive layer being bonded by polymer bonds.

10. The device of claim 9, wherein the integrated circuit device further comprises a third connector at a second side of the integrated circuit device, the second side of the integrated circuit device being opposite the first side of the integrated circuit device, and further comprising:
a third polymer adhesive layer at the second side of the integrated circuit device, the third polymer adhesive layer surrounding the third connector.

11. The device of claim 9, wherein the conductive connector has a first portion extending through the first polymer adhesive layer and a second portion extending through the second polymer adhesive layer, the first portion having first width, the second portion having a second width, the second width being greater than the first width.

12. The device of claim 11, wherein the air gap surrounds the first portion of the conductive connector.

13. The device of claim 9, wherein a width of the conductive connector decreases continually in a direction extending from the interposer to the integrated circuit device.

14. A device comprising:
a first integrated circuit device having a first connector at a first side of the first integrated circuit device;
a first polymer adhesive layer disposed on the first side of the first integrated circuit device;
a first redistribution structure comprising:
dielectric layers;
metallization patterns disposed between the dielectric layers; and
a second polymer adhesive layer disposed on a topmost metallization pattern of the metallization patterns, the second polymer adhesive layer being physically connected to the first polymer adhesive layer; and
a conductive connector extending through the first polymer adhesive layer and the second polymer adhesive layer, the conductive connector electrically connecting the topmost metallization pattern to the first connector, the conductive connector surrounded by an air gap.

15. The device of claim 14 further comprising:
a second integrated circuit device, the first redistribution structure being disposed at a first side of the second integrated circuit device;
a molding compound encapsulating the second integrated circuit device; and
a through via extending through the molding compound, the through via and the second integrated circuit device being electrically connected to the metallization patterns of the first redistribution structure.

16. The device of claim 15 further comprising:
a second redistribution structure, the second redistribution structure being disposed at a second side of the second integrated circuit device, the through via electrically connecting the first redistribution structure to the second redistribution structure.

17. The device of claim 14 further comprising:
a first conductive layer disposed on the first connector, the first polymer adhesive layer surrounding the first conductive layer, the conductive connector being physically and electrically connected to the first conductive layer with no seed layer disposed between the first conductive layer and the conductive connector.

18. The device of claim 17, wherein the first redistribution structure further comprises:
a second conductive layer disposed on a portion of the topmost metallization pattern, the second polymer adhesive layer surrounding the second conductive layer, the conductive connector being physically and electrically connected to the second conductive layer with no seed layer disposed between the second conductive layer and the conductive connector.

19. The device of claim 18, wherein the first conductive layer has a first width, the second conductive layer has a second width, and the first width is greater than the second width.

20. The device of claim 8 further comprising:
a first conductive layer between the first connector and the conductive connector, a first portion of the polymer adhesive material surrounding the first conductive layer; and
a second conductive layer between the second connector and the conductive connector, a second portion of the polymer adhesive material surrounding the second conductive layer, a first width of the first conductive layer being less than a second width of the second conductive layer.

* * * * *